United States Patent [19]
Peuse et al.

[11] Patent Number: 5,848,842
[45] Date of Patent: Dec. 15, 1998

[54] METHOD OF CALIBRATING A TEMPERATURE MEASUREMENT SYSTEM

[75] Inventors: Bruce W. Peuse, San Carlos; Gary E. Miner, Newark; Mark Yam, San Jose, all of Calif.

[73] Assignee: Applied Materials, Inc., Santa Clara, Calif.

[21] Appl. No.: 650,744

[22] Filed: May 20, 1996

Related U.S. Application Data

[62] Division of Ser. No. 359,302, Dec. 19, 1994, Pat. No. 5,660,472.

[51] Int. Cl.⁶ .................................................. G01K 51/00
[52] U.S. Cl. ....................................... 374/1; 374/2
[58] Field of Search ................................ 374/1, 2, 126, 374/128

[56] References Cited

U.S. PATENT DOCUMENTS

| | | |
|---|---|---|
| 3,796,099 | 3/1974 | Shimotsuma et al. . |
| 4,408,878 | 10/1983 | Fischbach ............................... 374/126 |
| 4,611,930 | 9/1986 | Stein . |
| 4,659,234 | 4/1987 | Brouwer et al. . |
| 4,708,474 | 11/1987 | Suarez-Gonzalez . |
| 4,881,823 | 11/1989 | Tanaka et al. ........................... 374/126 |
| 4,919,542 | 4/1990 | Nulman et al. ......................... 374/126 |
| 4,956,538 | 9/1990 | Moslehi . |
| 4,969,748 | 11/1990 | Crowley et al. ........................ 374/126 |
| 4,979,134 | 12/1990 | Arima et al. . |
| 4,984,902 | 1/1991 | Crowley et al. ............................. 374/1 |
| 5,011,295 | 4/1991 | Krishman et al. . |
| 5,029,117 | 7/1991 | Pattoon . |
| 5,061,084 | 10/1991 | Thompson et al. ...................... 374/128 |
| 5,226,732 | 7/1993 | Nakos et al. . |
| 5,326,171 | 7/1994 | Thompson et al. . |

FOREIGN PATENT DOCUMENTS

A 0 612 862  8/1994  European Pat. Off. .

OTHER PUBLICATIONS

Doering, "Microelectronics Manufacturing Science and Technology Program Extends Capabilities in Integrated-Circuit Manufacturing", Microelectronics Manufacturing Science & Technology, 2–64 (1994).

Apte et al., "Rapid Thermal Processing Uniformity Using Multivariable Control of a Circularly Symmetric 3 Zone Lamp", IEEE Transactions on Semiconductor Manufacturing, 5, 180–188 (1992).

(List continued on next page.)

*Primary Examiner*—William A. Cuchlinski, Jr.
*Assistant Examiner*—Andrew Hirshfeld
*Attorney, Agent, or Firm*—Fish & Richardson P.C.

[57] ABSTRACT

A method of calibrating a temperature measurement system including the steps of heating a first substrate having a high emissivity value to a first process temperature; while the first substrate is at the first process temperature, calibrating a first probe and a second probe to produce temperature indications from the first substrate that are substantially the same, the first probe having associated therewith a first effective reflectivity and the second probe having associated therewith a second effective reflectivity, the first and second effective reflectivities being different; heating a second substrate having a low emissivity value to a second process temperature, the low emissivity value being lower than the high emissivity value; with the second substrate at the second process temperature, using both the first probe and the second probe to measure the temperature of the second substrate, the first probe producing a first temperature indication and the second probe producing a second temperature indication different from the first temperature indication; measuring a sensitivity of the temperature indication produced by the first probe to changes in substrate emissivity; and by using the measured sensitivity and the first and second temperature indications, computing a correction factor for the first probe, the correction factor to be applied to subsequent temperature readings of the first probe to produce corrected temperature readings.

12 Claims, 12 Drawing Sheets

OTHER PUBLICATIONS

Roozeboom, "Manufacturing Equipment Issues In Rapid Thermal Processing ", Rapid Thermal Processing Science and Technology 349–423 (1993).

Pikashov et al., Determining Emissivity And True Surface Temperature By Means of A Pyrometer And An Attachment, Gas Institute, Kiev., translated form Inzhenerno–Fizicheskii Zhurnal, 16, 723–730 (1969).

Roozeboom, "Rapid Thermal Processing: Status, Problems and Options After the First 25 Years", Mat.Res.Soc.Symp-.Proc. 303, 149–164 (1993).

Gyurcsik, et al., "A Model For Rapid Thermal Processing: Achieving Uniformity Through Lamp Control", IEEE Transactions on Semiconductor Manufacturing, 4, 9–13 (1991).

Sorrell et al., "Temperature Uniformity in RTP Furances", IEEE Transactions on Electron Devices 39, 75–80 (1992).

A. Honda et al., "New Radiation Thermometry Using Multiple Reflection For Temperature Measurement of Steel Sheets", American Institute of Physics 923–927.

A. Gouffé, Revue D'optique 24, 1–10 (1945) with translation.

Dilhac et al., "Temperature Control in a Rapid Thermal Processor", IEEE Transactions on Electron Devices, 39 201–203 (1992).

Norman, "Optimization of Transient Temperature Uniformity in RTP Systems", IEEE Transactions On Electron Devices 39, 205–207 (1992).

Deardorff, "Elimination of reflection errors in emissometers by using alternate apertures," Rev. Sci. Instrum., vol. 47 No. 10:1279–1282 (Oct. 1976).

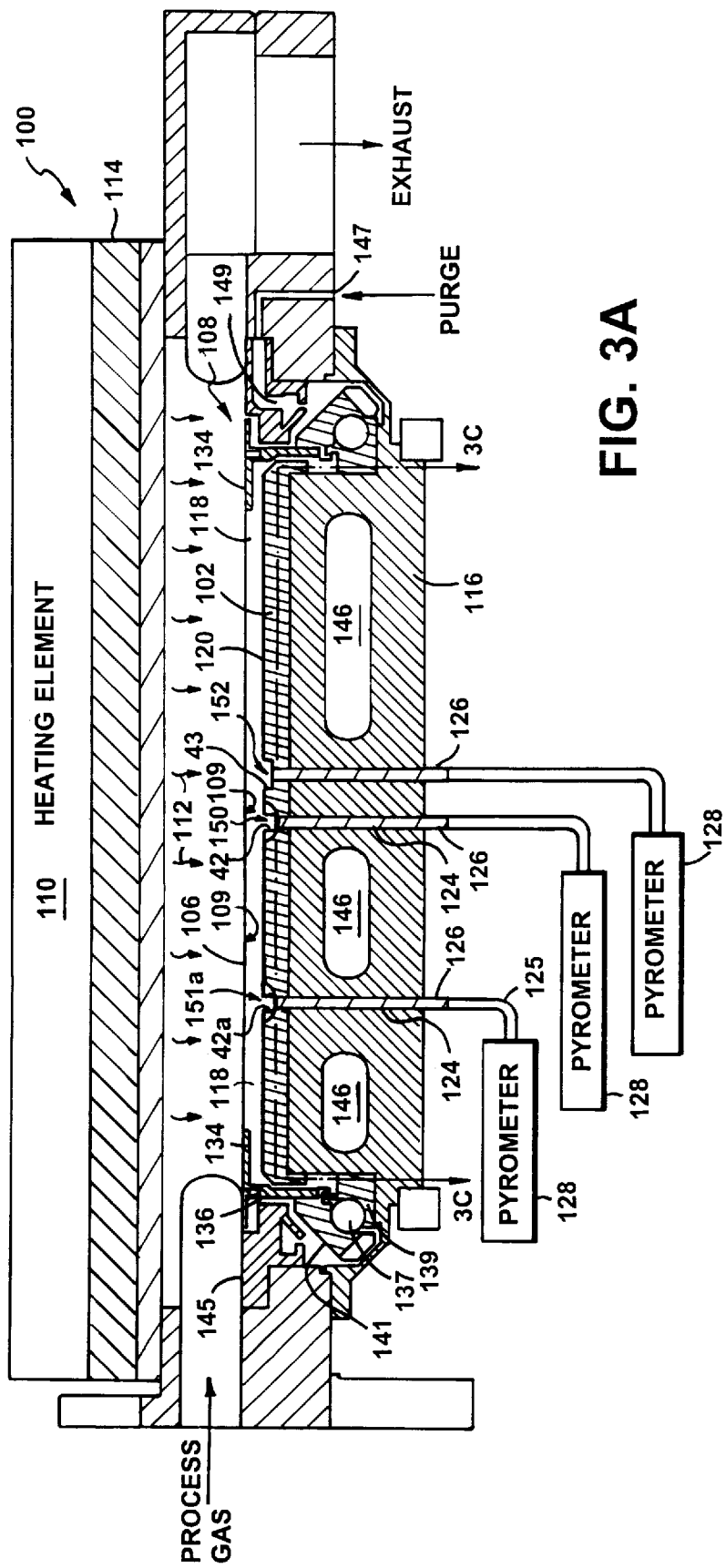

TO PYROMETER

TO PYROMETER

METHOD OF CALIBRATING A TEMPERATURE MEASUREMENT SYSTEM

This is a divisional of application Ser. No. 08/359,302, filed Dec. 19, 1994, now U.S. Pat. No. 5,660,472.

BACKGROUND OF THE INVENTION

The invention relates to techniques for making improved noncontact temperature measurements of a semiconductor substrate by enhancing the effective emissivity of the substrate and by correcting measurements of substrate temperature.

In many semiconductor device manufacturing processes, the required high levels of device performance, yield, and process repeatability can only be achieved if the temperature of a substrate (e.g., a semiconductor wafer) is tightly controlled during processing. To achieve that level of control, it is often necessary to measure the substrate temperature in real time and in situ, so that any unexpected temperature variations can be immediately detected and corrected for.

For example, consider rapid thermal processing (RTP), which is used for several different fabrication processes, including rapid thermal annealing (RTA), rapid thermal cleaning (RTC), rapid thermal chemical vapor deposition (RTCVD), rapid thermal oxidation (RTO), and rapid thermal nitridation (RTN). In the particular application of CMOS gate dielectric formation by RTO or RTN, thickness, growth temperature, and uniformity of the gate dielectrics are critical parameters that influence the overall device performance and fabrication yield. Currently, CMOS devices are being made with dielectric layers that are only 60–80 Å thick and for which thickness uniformity must be held within ±2 Å. This level of uniformity requires that temperature variations across the substrate during high temperature processing cannot exceed a few °C.

The wafer itself often cannot tolerate even small temperature differentials during high temperature processing. If the temperature difference is allowed to rise above 1°–2° C./cm at 1200° C., the resulting stress is likely to cause slip in the silicon crystal. The resulting slip planes will destroy any devices through which they pass. To achieve that level of temperature uniformity, reliable real-time, multi-point temperature measurements for closed-loop temperature control are necessary.

Optical pyrometry is being widely used for measuring temperatures in RTP systems. Pyrometry exploits a general property of objects, namely, that objects emit radiation with a particular spectral content and intensity that is characteristic of their temperature. Thus, by measuring the emitted radiation, the objects temperature can be determined. A pyrometer measures the emitted radiation intensity and performs the appropriate conversion to obtain temperature (T). The relationship between spectral emitted intensity and temperature depends on the spectral emissivity of the substrate and the ideal blackbody radiation-temperature relationship, given by Planck's law:

$$I_b(\lambda,T) = \frac{2C_1}{\lambda^5 \left( e^{\frac{C_2}{\lambda T}} - 1 \right)} \quad (1)$$

where $C_1$ and $C_2$ are known constants, $\lambda$ is the radiation wavelength of interest, and T is substrate temperature measured in °K. According to an approximation known as Wein's distribution law, this expression can be rewritten as follows:

$$I_b(\lambda,T) \approx K(\lambda) \cdot e^{-\frac{C_2}{\lambda T}} \quad (2)$$

where $K(\lambda)=2C_1/\lambda^5$. This is a good approximation for temperatures below about 2700° C.

The spectral emissivity $\epsilon(\lambda,T)$ of an object is the ratio of its emitted spectral intensity $I(\lambda,T)$ to that of a blackbody at the same temperature $I_b(\lambda,T)$. That is, $$\epsilon = \frac{I(\lambda,T)}{I_b(\lambda,T)} \quad (3)$$

Since $C_1$ and $C_2$ are known constants, under ideal conditions, the temperature of the wafer can be accurately determined if $\epsilon(\lambda,T)$ is known.

However, despite its widespread use in the semiconductor industry, optical pyrometry still suffers from limitations due to an inability to accurately measure the emissivity of the substrate. Moreover, even if the emissivity of the substrate is known at a given temperature, it changes with temperature. The changes are usually not accurately measurable and thus they introduce an unknown error into the temperature measurements. Errors on the order of 10° C. or more are not uncommon.

The emissivity of a substrate depends on many factors, including the characteristics of the wafer itself (e.g. temperature, surface roughness, doping level of various impurities, material composition and thickness of surface layers), the characteristics of the process chamber, and the process history of the wafer. Therefore, a priori estimation of substrate emissivity cannot provide a general purpose pyrometric temperature measurement capability.

Techniques for reducing the effect of changes in wafer emissivity on temperature measurements are known. One such technique involves placing a thermal reflector near the back surface of a target substrate to form a reflecting cavity which causes thermal radiation from the substrate to be reflected back to the substrate. A light pipe, which is inserted through the reflector into the cavity, samples radiation from the reflecting cavity and delivers the sampled light to a pyrometer. Assuming an ideal reflector, it can be shown mathematically that because all of the thermal radiation emitted from the substrate is reflected back onto the substrate, the reflecting cavity acts like an ideal black body. That is, the intensity of the thermal radiation within the reflecting cavity will not be a function of the emissivity of the surface of the substrate. Stated differently, in the ideal case the reflecting cavity increases the effective emissivity of the substrate to a value equal to one. However, because the reflector will be less than perfect, the effective emissivity of the substrate will be higher than the emissivity of the wafer but less than one. Nevertheless, variations in the actual emissivity of the wafer will have considerably less impact on the measured temperature.

Though the above-mentioned temperature measurement schemes have achieved acceptable results, there is still considerable room for improvement.

SUMMARY

In general, in one aspect the invention is a method of correcting a temperature probe reading in a thermal processing chamber for heating a substrate. The method includes heating the substrate to a process temperature; using a first probe and a second probe to measure the temperature of the substrate; and from first and second temperature indications produced by the first and second probes, respectively, deriving a corrected temperature reading for the first probe that is a more accurate indicator of an actual temperature of the substrate than are uncorrected readings produced by both the first and second probes. The first and second probes have different effective reflectivities.

In preferred embodiments, the invention also includes using a first noncontacting probe for the first probe and using a second noncontacting probe for the second probe, e.g. optical pyrometers. The temperature measurements that are performed using the first and second probes are performed closely in time, e.g. concurrently. The first effective reflectivity is larger than the second effective reflectivity. The deriving step includes correcting the temperature indication of the first probe by adding a correction quantity that is derived from a difference between the first and second temperature indications. In addition, the deriving step also includes determining a difference between the first and second temperature indications and multiplying that temperature difference by a correction factor to generate the correction quantity.

In general, in another aspect, the invention is a method of calibrating a temperature measurement system. The method includes heating a first substrate having a high emissivity to a first process temperature; while the substrate is at the first process temperature, calibrating a first probe and a second probe to produce temperature indications that are substantially the same; heating a second substrate having a low emissivity to a second process temperature; with the second substrate at said second process temperature, using both the first and second probes to measure the temperature of the substrate; measuring a sensitivity of the temperature readings produced by the first probe to changes in substrate emissivity; and by using the measured sensitivity and first and second temperature indications produced by the first and second probes, respectively, computing a correction factor for the first probe. In addition, the first probe has a first effective reflectivity and the second probe has a second effective reflectivity that is different from the first effective reflectivity. The correction factor is applied to temperature readings of the first probe to produce a corrected temperature reading.

In general, in still another aspect, the invention is an apparatus for measuring the temperature of a substrate in a thermal processing heating chamber. The apparatus includes a reflecting plate placed next to one surface of the substrate to form a reflecting cavity therebetween; a first probe positioned to receive energy from the reflecting cavity and produce a first temperature reading; and a second probe positioned to receive energy from the reflecting cavity and produce a second temperature reading. The first probe yields a different effective reflectivity for the cavity than does the second probe.

In general, in another aspect, the invention is an apparatus for measuring the temperature of a localized region on a substrate in a thermal processing chamber. The apparatus includes a support structure supporting the substrate within the thermal processing chamber; an energy probe having an end receiving radiation from the substrate during thermal processing and providing a signal representative of the temperature of a localized region of the substrate; and a concave microcavity formed around the end of the energy probe. The concave microcavity has a radiation reflecting surface facing the localized region of the substrate and serving to enhance the probe signal.

Among the advantages of the invention are the following. The microcavity structure tends to increase the effective reflectivity of the cavity formed between the backside of the wafer and the reflecting plate and thereby permits temperature measurements that have substantially reduced sensitivity to substrate emissivity variations. In addition, the invention provides real time, in situ temperature compensation that accommodates changes in emissivity as a function of temperature. The calibration procedure is simple and typically only needs to be implemented once for a given chamber structure. Temperature measuring according to the invention permits the use of stable, repeatable solid-state detectors. The invention enables reliable temperature measurements with enhanced repeatability and uniformity.

Other features and advantages will be apparent from the following description and the claims.

BRIEF DESCRIPTION OF THE DRAWINGS

FIG. 3A is a cross-sectional side view of an RTP system;

DESCRIPTION OF THE PREFERRED EMBODIMENTS

The Virtual Blackbody Cavity

In the following description, we will refer to measuring the temperature of a substrate. We intend the term "substrate" to broadly cover any object that is being processed in a thermal process chamber and the temperature of which is being measured during processing. The term "substrate" includes, for example, semiconductor wafers, flat panel displays, glass plates or disks, and plastic workpieces.

To understand the present invention, it will be useful to first review the emissivity enhancement technique referred to above.

Figure 1:
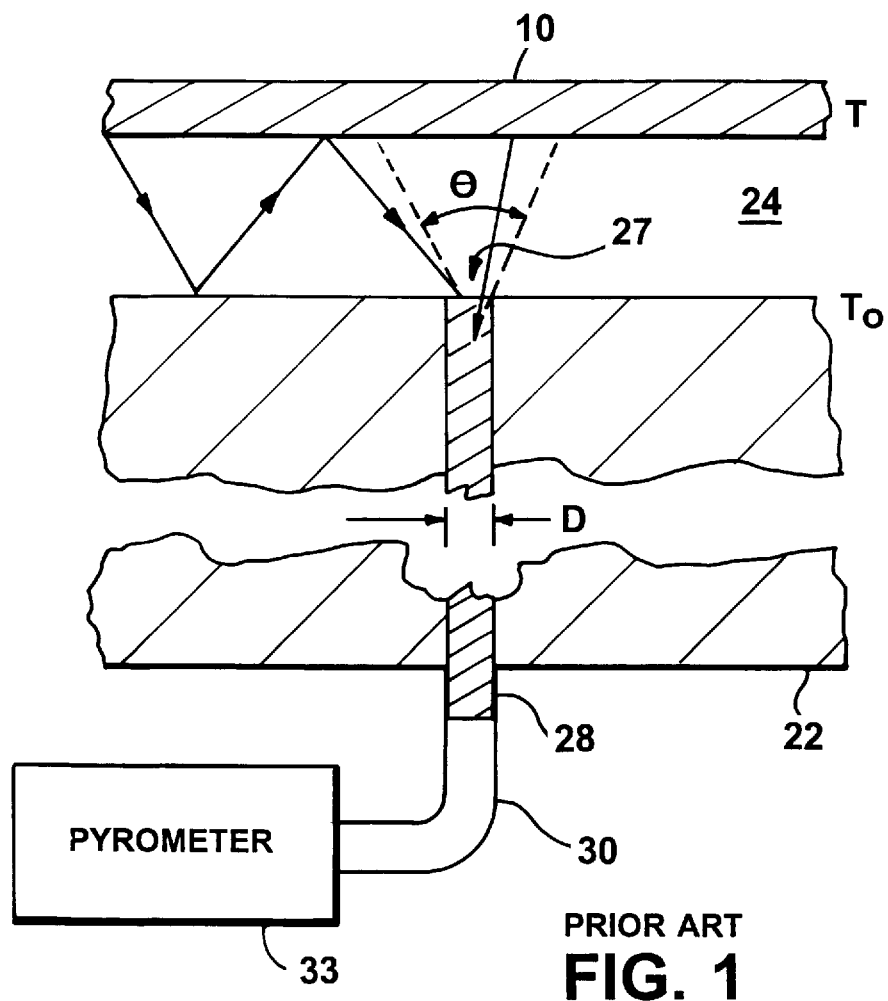
FIG. 1 is a diagrammatic cross-sectional side view of a substrate temperature measuring scheme in which a reflector is positioned near a substrate.

As shown in FIG. 1, a thermal reflector 22 is positioned near substrate 10 to create a virtual blackbody cavity 24 between the reflector and the substrate. If the substrate backside is diffuse, the radiation is emitted from it in a random pattern and thus the emitted radiation is reflected throughout the cavity in an equally random (isotropic) pattern. The radiation arriving at any location on the surface of reflector 22 is made up of many components: one component is made up of the radiation coming directly from the substrate and has experienced no reflections; a second component has experienced only one reflection off of reflector 22 and the backside of substrate 10; a third component has experienced two reflections off of reflector 22 and the backside of substrate 10; etc. The total intensity available at a point on the reflector plate can be found by summing over an infinite series of components of impinging radiation as follows:

$$I_T = \epsilon \cdot \sigma \cdot T^4 \cdot \sum_n R_n \cdot (1-\epsilon)^n \quad (5A)$$

$$I_T = \frac{\epsilon \cdot \sigma \cdot T^4}{1 - R(1-\epsilon)} \quad (5B)$$

where the reflectivity of the cold reflector plate is given by R, the emissivity of the wafer by $\epsilon$ and $\sigma$ where a is the Stefan-Boltzman constant and T is the temperature of the substrate.

Assuming that the reflectivity of the reflector is equal to one (R=1), then Eq. 5B reduces to:

$$I_T = \sigma T^4, \quad (5C)$$

in which the radiation $I_T$ is independent of emissivity of the backside of the substrate. Stated differently, the reflector produces a virtual blackbody cavity for which the "effective emissivity" of the substrate is equal to 1.

Note that this emissivity enhancing effect does not require that the backside of the wafer be diffuse. It will work for substrates having backsides that are perfectly specular reflectors as well as for substrates having backsides that are highly diffuse. In general, semiconductor wafer backsides are some combination of diffuse and specular.

A light pipe 28 is used to sample radiation in the cavity through an aperture 27 in the reflector. The sampled intensity is passed through an optical fiber 30 to a pyrometer 33 where it is converted to temperature by using Eq. 5, above. Because of the virtual blackbody cavity effect, the measured temperature will be independent of changes in emissivity of the substrate.

In reality, however, the reflectivity of the reflector, though close to 1, will not be equal to 1. For one thing, the coating on the reflector will not be perfectly reflecting. For example, gold which is one of the better reflective coating materials, has a reflectivity of only about 0.975 at a wavelength of 950 nm (nanometers). In addition, it has become apparent that the presence of the one or more apertures in the reflector for sampling the radiation, as well as the overall geometry of the cavity (i.e., dimensions and shape), also tend to lower the performance of the virtual blackbody cavity we are trying to create here. These geometric effects together with the actual reflectivity can be lumped together into an "effective reflectivity" term $R_{eff}$. Though it is possible to substantially reduce the impact that changes in substrate emissivity have on the sampled intensity, the measurements will nevertheless not be completely independent of the emissivity of the substrate.

Assuming reflector 22 is opaque, cold, and highly reflective (i.e., R→1), we can ignore the effects of radiation emitted by the reflector, and the effective emissivity, $\epsilon_{eff}$, of the substrate can be approximated by:

$$\epsilon_{eff}(\epsilon, R_{eff}) = \frac{\epsilon}{1 - R_{eff} \cdot (1-\epsilon)} \quad (6)$$

where $R_{eff}$ is the effective reflectivity of the reflecting cavity. Note that if $R_{eff}$ does equal 1, then $\epsilon_{eff}$ will also equal 1 as it should. On the other hand, if $R_{eff}$ is less than 1, $\epsilon_{eff}$ will also be less than 1 and the measured temperature will be a function of emissivity.

Figure 2:
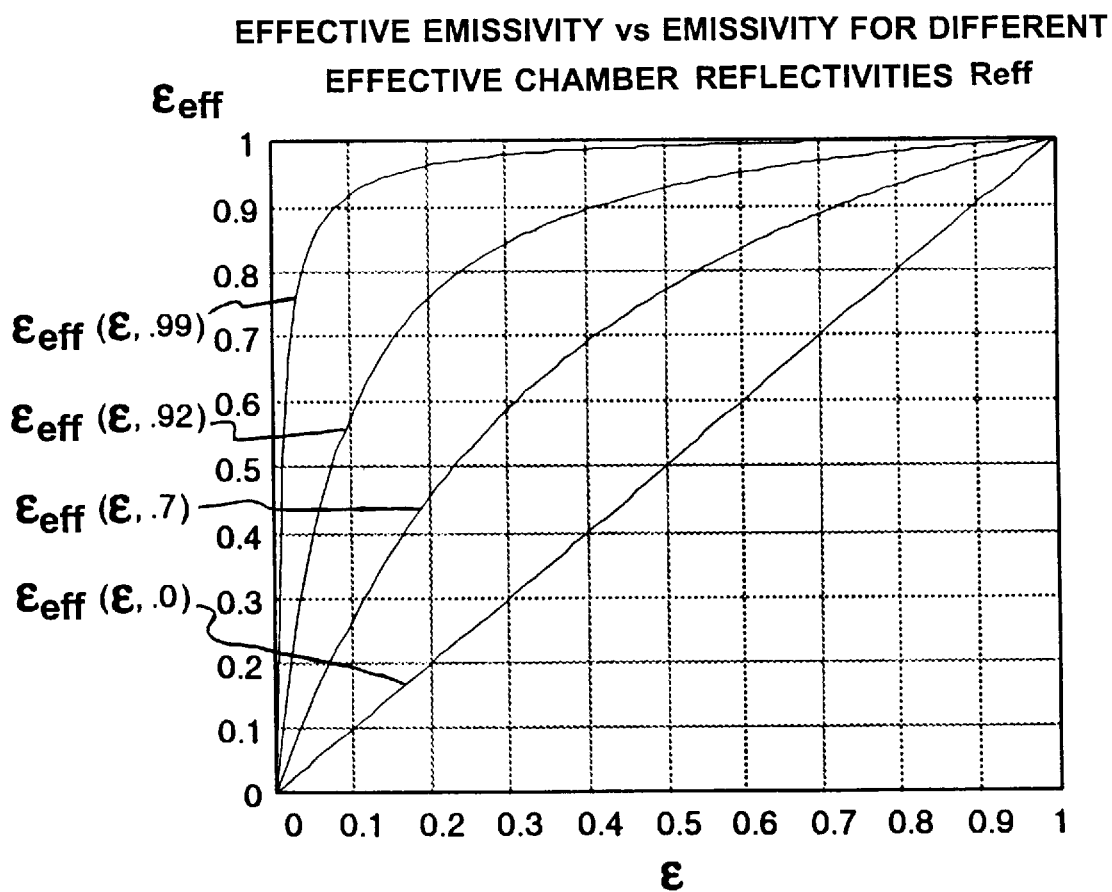
FIG. 2 is a graph of effective emissivity as a function of actual emissivity plotted for different values of effective reflectivity.

In FIG. 2, effective emissivity, $\epsilon_{eff}$, is plotted as a function of the actual emissivity, $\epsilon$, for different values of $R_{eff}$. As indicated, the effective emissivity of the substrate approaches 1 as the effective reflectivity of the reflecting cavity approaches 1. Also, as $R_{eff} \to 1$, the effective emissivity of the substrate becomes less sensitive to changes in the actual emissivity of the substrate, especially for high values of actual emissivity. This sensitivity can be quantified as follows:

$$\Delta\epsilon_{eff} = \frac{(1 - R_{eff}) \cdot \Delta\epsilon}{\{1 - R_{eff} \cdot (1-\epsilon)\}^2} \quad (7)$$

which is obtained by taking the derivative of Eq. 6 with respect to $\epsilon$.

The resulting error in the temperature measurement is related to variations in the effective emissivity as follows:

$$\frac{\Delta T}{T} = \frac{\lambda \cdot T}{C_2} \cdot \frac{\Delta\epsilon_{eff}}{\epsilon_{eff}} \quad (8a)$$

Using Eqs. 6 and 7, we obtain:

$$\frac{\Delta T}{T} = \frac{\lambda \cdot T}{C_2} \cdot \frac{(1 - R_{eff})}{\{1 - R_{eff} \cdot (1-\epsilon)\}} \cdot \frac{\Delta\epsilon}{\epsilon}$$

Note that as $R_{eff}$ approaches one, the numerator and thus, the sensitivity of the measured temperature to changes in substrate emissivity, become vanishingly small. Conversely, if the effective reflectivity of the cavity is not sufficiently high (i.e., close to one), the variations in the temperature measurement that are due to variations in substrate emissivity can remain unacceptably large.

Referring again to FIG. 1, the presence of aperture 27 introduces a localized disturbance in the virtual blackbody cavity 24 created between the reflector and the substrate. We have come to realize that such disturbances also reduce the emissivity-enhancing effect produced by the reflector. Moreover, the size of the disturbance tends to increase with increasing aperture size (D). Thus, one approach to minimizing the effect of the aperture on emissivity enhancement might be to reduce the size of the aperture. However, since the amount of light collected by the light pipe is proportional to the area of the aperture, this reduces the amount of light collected by the light pipe which, in turn, reduces the signal-to-noise ratio of the detection system. Since radiation intensity drops off rapidly as substrate temperature decreases, using a smaller aperture can significantly increase the temperature below which the detector is no longer useful.

We have discovered, however, that by modifying the base reflector in an RTP system to include a measurement-enhancing surface feature at the end of the light probe, we can further increase the virtual blackbody effect of the reflecting cavity while also obtaining an improved signal-to-noise in the sampled signal.

An RTP System Incorporating the Invention
Overview of the RTP System
An RTP system that has been modified in accordance with the invention is shown in FIG. 3A. The RTP system includes a processing chamber 100 for processing a disk-shaped, eight inch (200 mm) diameter silicon substrate 106. The substrate 106 is mounted inside the chamber on a substrate support structure 108 and is heated by a heating element 110 located directly above the substrate. The heating element 110 generates radiation 112 which enters the processing chamber 100 through a water-cooled quartz window assembly 114 which is approximately one inch (2.5 cm) above the substrate. Beneath substrate 106 is a reflector 102 which is mounted on a water-cooled, stainless steel base 116. Reflector 102 is made of aluminum and has a highly reflective surface coating 120. The underside of substrate 106 and the top of reflector 102 form a reflecting cavity 118 for enhancing the effective emissivity of the substrate.

The separation between the substrate and reflector is approximately 0.3 inch (7.6 mm), thus forming cavity which has a width-to-height ratio of about 27. In processing systems that are designed for eight-inch silicon wafers, the distance between the substrate 106 and reflector 102 is between 3 mm and 9 mm, and preferably between 5 mm and 8 mm and the width-to-height ratio of cavity 118 should be larger than about 20:1. If the separation is made too large, the emissivity-enhancement effect that is attributable to the virtual blackbody cavity that is formed will decrease. On the other hand, if the separation is too small, e.g. less than about 3 mm, then the thermal conduction from the substrate to the cooled reflector will increase, thereby imposing an unacceptably large thermal load on the heated substrate. Since the main mechanism for heat loss to the reflecting plate will be conduction through the gas, the thermal loading will, of course, depend up the type of gas and the chamber pressure during processing.

The temperatures at localized regions 109 of substrate 106 are measured by a plurality of temperature probes 126 (only two of which are shown in FIG. 3A). The temperature probes are sapphire light pipes that pass through a conduit 124 that extends from the backside of base 116 through the top of reflector 102. Sapphire light pipes 126 are about 0.125 inch in diameter and conduits 124 are slightly larger to enable them to be easily inserted into the conduits.

The Emissivity Enhancing Surface Features

Figure 4A:
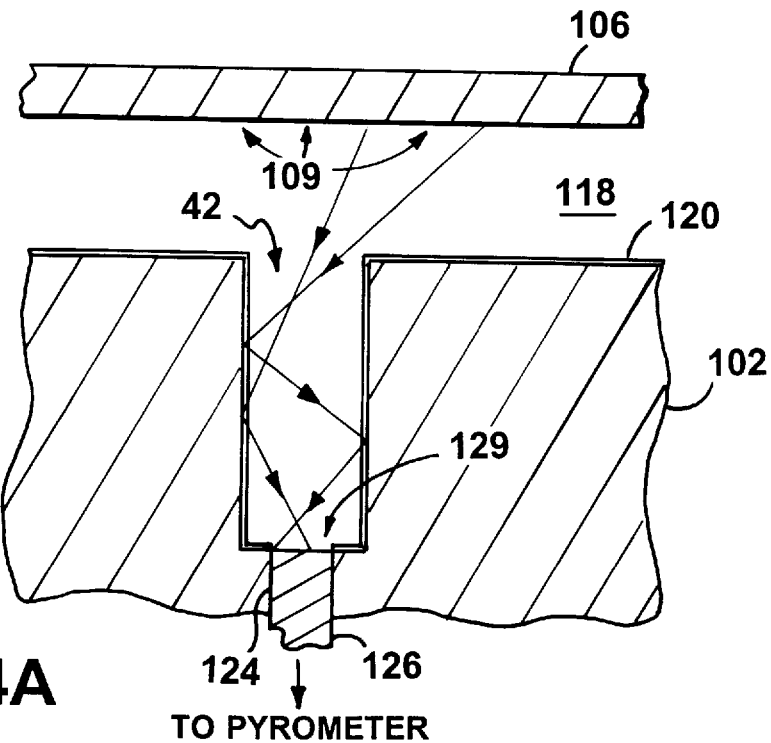
FIGS. 4A–D are cross-sectional side views of various measurement-enhancing surface features that are incorporated into the reflector.

In accordance with one aspect of the invention, a small reflective cavity 42 (i.e., a microcavity) is formed in the top surface of reflector 102 where the conduit passes through to the top of the reflector (shown more clearly in FIG. 4A). The conduit enters the small cavity forming an aperture 129 at the bottom of the small cavity. Sapphire light pipe 126 is positioned within conduit 124 so that its uppermost end is flush with or slightly below the bottom of microcavity 42. The other end of light pipe 126 couples to a flexible optical fiber 125 that transmits sampled light from the cavity to a pyrometer 128.

In the described embodiment, the surface microcavity is cylindrically shaped, has a radius (R) of about 0.100 inch and a depth (L) of about 0.300 inch. Aperture 129 at the bottom of microcavity 42 and conduit 124 are slightly larger than about 0.125 inch, which as noted above, is the diameter of the sapphire light pipe. Surface microcavity 42 functions to enhance the virtual blackbody effect of reflecting cavity 118 that is present between the backside of substrate 106 and the top of reflector 102, thereby increasing the effective emissivity of the substrate to a value that is even closer to one. The cylindrical microcavity both increases the signal-to-noise ratio of the sampled signal that is detected by the light pipe and it functions to increase the effective emissivity of the substrate (or equivalently, the effective reflectivity of the reflecting cavity). We further note that the enhancement effect does not appear to be strongly dependent on whether the probe end is flush with the bottom of surface microcavity 42 or is placed below that point, recessed within conduit 124. Thus, the operation of inserting the probe into the conduit during the assembly of the reflector is made easier by not having to satisfy close critical tolerances regarding the placement of the probe end. However, the probe end should not protrude into the surface microcavity since this seems to degrade the enhancement effect.

Assuming perfectly reflecting sidewalls in the cylindrical microcavity, the enhancement effect caused by the cylindrical microcavity increases as the L/R ratio of the microcavity increases. However, since the sidewalls are not perfectly reflecting, the more times the collected radiation reflects back and forth within the cavity, the more its signal strength will be diminished by the losses which occur upon each reflection. Therefore, as a practical matter there is a limit to how large one can make the L/R aspect ratio of the cylindrical microcavity and still obtain improvements in performance.

Surface microcavity 42, which is formed around the end of the probe, appears to work by increasing the level of self-irradiation of a localized region of the substrate backside, by increasing the collection efficiency of the probe, or by a combination of both mechanisms. In other words, the surface cavities increase, relative to a planar reflector, the amount of light that reflects from the reflector back at the localized region 109 on the substrate at which point the temperature is to be measured and thereby also increases the probe's collection of radiation.

In the described embodiment, to achieve the high reflectivity that is desired for the reflector, a highly reflective multi-layered coating 120 is formed on top of the reflector. The bottom layer of the coating is a thin layer of gold, which is deposited onto the surface of the reflector body. Gold is preferred because it has a reflectivity of about 0.975 in the infra-red wavelength range of interest (i.e., about 950 nm). To further enhance the reflectivity of the gold layer, a quarter-wave stack is formed on top of the gold layer. The quarter-wave stack is made up of alternating dielectric layers which have different indices of refraction and have a thickness equal to ¼ of the wavelength to which the pyrometer is most sensitive (e.g., ¼ of 950 nm). In the described embodiment, the quarter-wave stack was applied by OCLI (Optical Coating Laboratory, Inc.) of Santa Rosa, Calif., although other acceptable commercial sources are also available for applying such coatings.

The top layer of the multi-layered structure is a passivation layer, which prevents the gold of the reflecting layer from possibly contaminating the RTP chamber. The passivation layer may be made of silicon dioxide, aluminum oxide, silicon nitride, or any other acceptable material that will passivate the reflecting layer without degrading its reflective properties at the wavelength of interest.

The reflectivity of this multi-layered structure is about 0.995 at 950 nm, which is significantly higher than the natural reflectivity of 0.975 for a single thin gold film.

If gold is an unacceptable material for the reflecting, other reflecting materials may, of course, be used. For example, nickel is more inert than gold and has a good reflectivity, though not as high as gold.

Figure 4B:
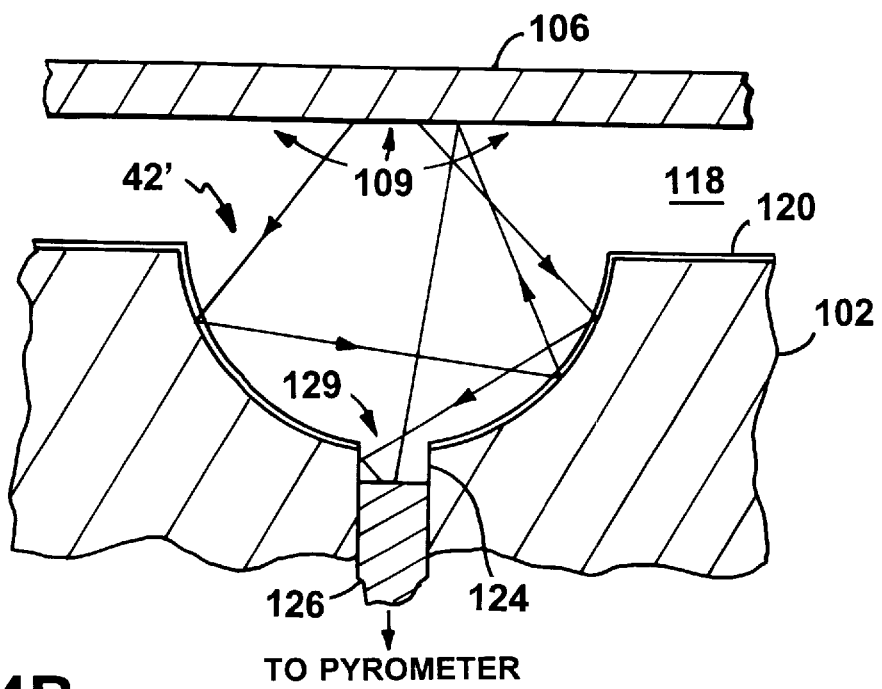

Many other alternative geometries are possible for the surface microcavity. For example, a hemispherical microcavity 42', such as is shown in FIG. 4B, may be used. The microcavity is spherical in shape, with its center located in the plane of the reflector surface. For the RTP embodiment described above, the radius of the sphere is about 6–8 millimeters, i.e., comparable to the separation between the reflector and the back of the substrate. Sapphire probe 126 is 0.125 inch in diameter, although it may be desirable to use a smaller size (e.g. 0.050 inch) to minimize the disturbance that the probe might cause to the substrate temperature in the localized region 109.

Figure 4C:
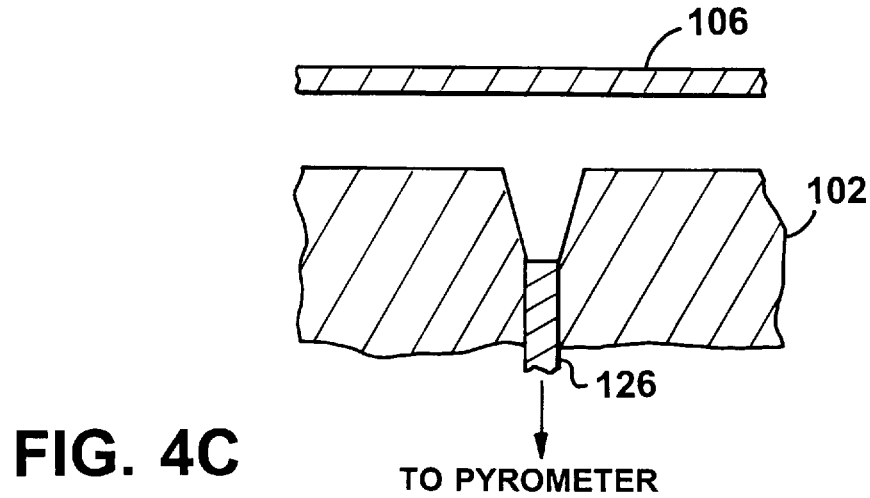
Figure 4D:
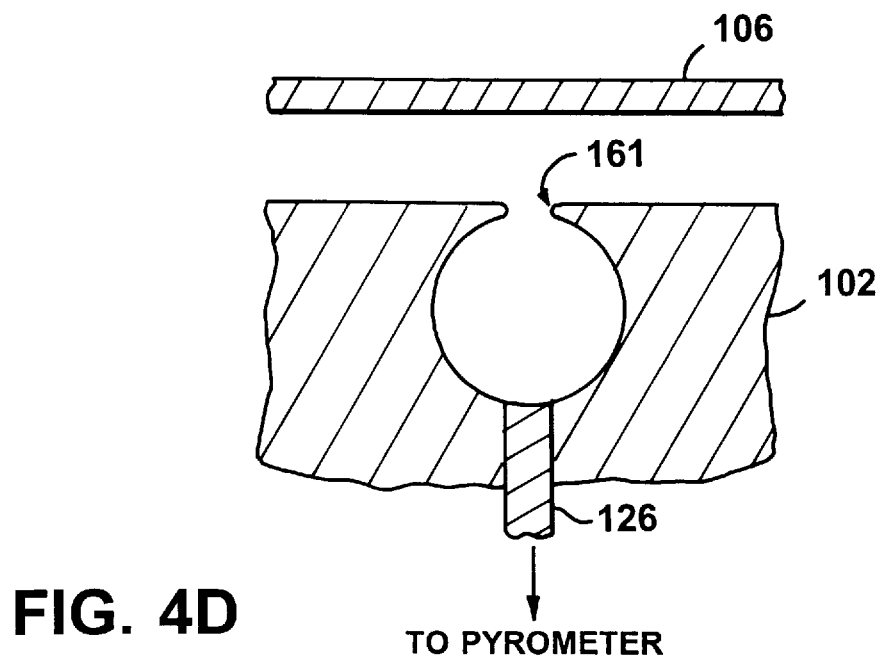

Other microcavity geometries are shown in FIGS. 4C–D. FIG. 4C shows a conical-shaped microcavity with the light pipe located at the vortex of the cone. FIG. 4D shows a spherical microcavity with the light pipe located opposite a circular aperture 161 in the surface of the reflector. These are just a few of the many alternative geometries that could be used. The particular microcavity geometry that is most appropriate for a given application can be empirically determined. In addition, the microcavity could also be a raised microcavity that is formed in material that protrudes from the surface of the reflecting plate.

Emissivity Corrected Temperature Measurements

Even though the use of a microcavity in the surface of the reflector around the end of the probe produces a reflecting cavity that more closely approximates a virtual blackbody, the effective emissivity will still not be identically equal to one. In other words, the measured temperatures will have an unknown error component attributable to variations in emissivity from one substrate to the next. Thus, it may be desirable to further improve the accuracy of the temperature measurement by measuring and correcting for variations in the actual emissivity of the substrates that are being processed in the RTP chamber. The accuracy of real time, in situ temperature measurement may be improved by measuring the temperature at a particular localized region of a substrate using two temperature probe assemblies that are characterized by different effective emissivities (or equivalently, different effective reflectivities). The temperatures measured by these probes can then be used to obtain a correction for localized temperature measurements.

Referring again to FIG. 3A, two radiation probes 150, 152 having different effective emissivities $\epsilon_1$, $\epsilon_2$ are used. Probe 150 is located inside a cylindrical surface microcavity, as previously described and as shown more clearly in FIG. 4B, and probe 152 is raised above the reflector surface to within about 3–4 millimeters of the backside of substrate 106. The second probe, however, should not be placed too close to the backside of the substrate (and away from the cooled reflecting plate) so as to avoid it being heated up by the radiation from the hot substrate during processing. If the probe is allowed to get too hot it can damage the probe and/or material may deposit on the probe, thereby degrading its performance. In addition, having the probe too close to the backside of the substrate may impact the temperature of the substrate.

In the configuration just described, the effective emissivity for the first probe (i.e., probe 150) will be larger than the effective emissivity for the second probe (i.e., probe 152). Alternatively to placing probe 152 closer to the backside of substrate 106, it could be placed in a cylindrical microcavity which has its bottom covered with a non-reflecting material. Other combinations of geometries are also possible so long as the two probes yield different effective emissivities. As will become apparent later, it is preferable that the two selected probe geometries produce a difference in associated effective emissivities that is maximized.

In the described embodiment, probes 150, 152 are spaced-apart by sufficient distance so that the hole producing the lower effective emissivity does not interfere with or degrade the effective reflectivity of the other probe. However, the two probes should not be spaced so far apart that they do not measure the temperature of roughly the same region of the substrate. For the described embodiment, a typical separation which appears to meet these requirements is between 1 to 3 cm. If the substrate rotates, this means that the radii at which the two probes are located should differ by no more than this amount.

Calibration

Figure 5:
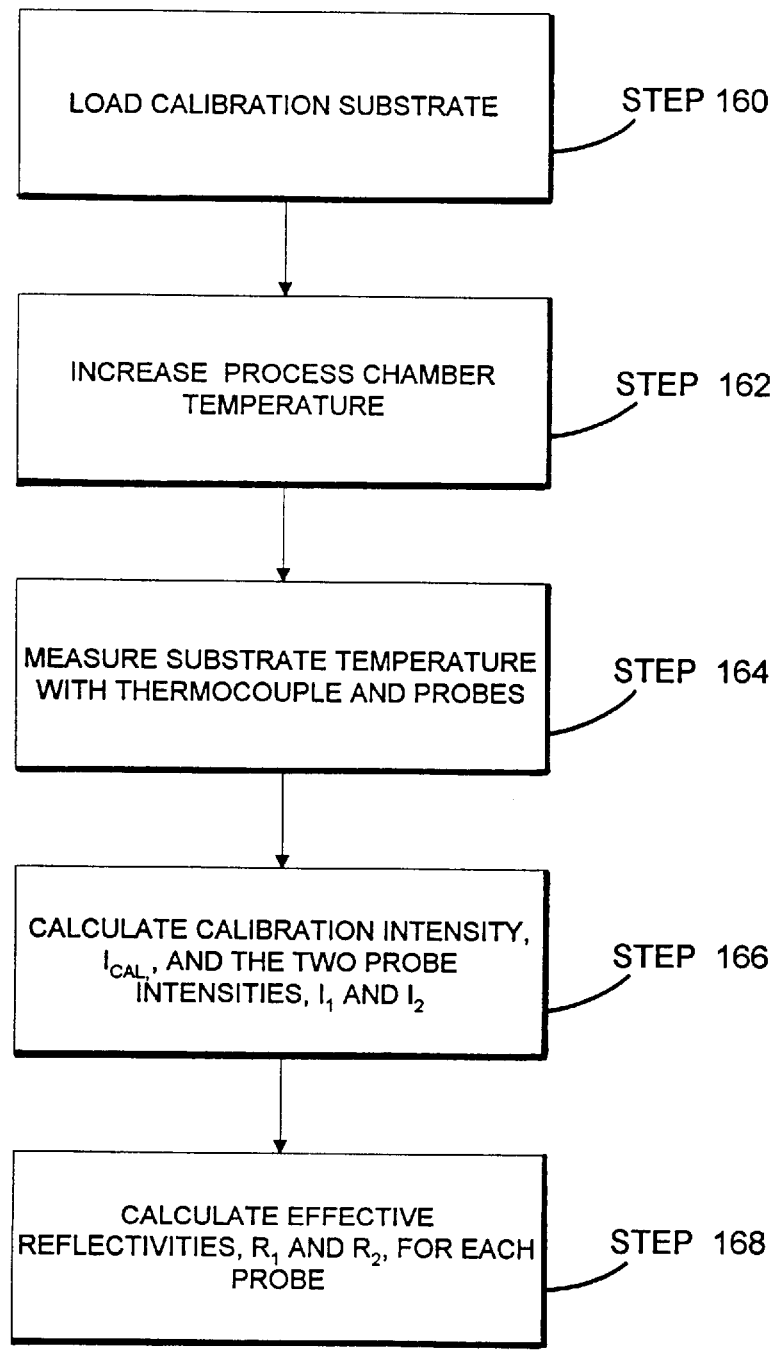
FIG. 5 is a flow diagram of a scheme for calibrating an RTP chamber for in situ temperature correction.

To perform the temperature correction, the two probes must first be calibrated. That is, the effective reflectivity for each probe must first be determined. This is done with the aid of a special calibration substrate and by using the procedure outlined in FIG. 5.

The calibration substrate is a standard substrate having a known, previously measured, emissivity, $\epsilon_{cal}$, and having a thermocouple embedded in it. The actual substrate temperature can be accurately measured with the thermocouple and then be compared to the temperatures reported by the pyrometers. Such substrates are commercially available from several companies, including, for example, SensArray of Santa Clara, Calif. USA. Preferably, the calibration substrate is selected to have substantially the same thermal properties as the type of substrates that are to be processed in the RTP chamber. For example, the calibration substrate should at least be made of the same material as the process substrates (e.g. silicon) and it should have the same type of backside as do the process substrates (e.g. a diffuse, lapped surface).

To determine the effective reflectivity associated with each of probes 150, 152 ($R_{e1}$, $R_{e2}$), the calibration substrate is loaded into the process chamber (step 160) and the temperature of the processing chamber is increased to a predetermined setting (step 162). When the desired temperature has been reached, the temperature of the substrate is measured by using the embedded thermocouple and each of the two probes 150, 152 (step 164), thereby producing three separate temperature measurements, $T_{real}$ (the actual temperature of the substrate), $T_1$ (the temperature as measured by the first probe), and $T_2$ (the temperature as measured by the second probe).

These temperatures are converted to intensities, $I_{cal}$, $I_1$ and $I_2$ (step 166). $I_{cal}$ is the intensity that a probe would receive if the cavity was actually an ideal blackbody cavity. It is computed using Eq. 1 from the temperature measured by the thermocouple, $T_{real}$, as follows:

$$I_{cal}(\lambda) = \frac{2C_1}{\lambda^5 \left( e^{\frac{C_2}{\lambda T_{real}}} - 1 \right)} \quad (9)$$

The temperatures that are recorded of by pyrometers, $T_1$ and $T_2$, are converted back to the corresponding intensities ($I_1$, $I_2$) in a similar manner:

$$I_{1,2}(\lambda) = \frac{2C_1}{\lambda^5 \left( e^{\frac{C_2}{\lambda T_{1,2}}} - 1 \right)} \quad (10)$$

The effective emissivities for probes 150, 152 are equal to:

$$\epsilon_{1,2} = \frac{I_{1,2}}{I_{cal}} \quad (11)$$

With the intensities $I_{cal}$, $I_1$ and $I_2$ known, the effective reflectivities for each of the probes can then be computed. From Eq. 6, the effective reflectivity can be written as a function of the actual emissivity and effective emissivity, as follows:

$$R_{1,2} = \frac{1 - \frac{\epsilon_{cal}}{\epsilon_{1,2}}}{1 - \epsilon_{cal}} \quad . \tag{12}$$

Since the effective emissivities can be expressed in terms of the measured intensities (see Eq. 11), this equation can be rewritten as:

$$R_{1,2} = \frac{1 - \frac{\epsilon_{cal} I_{cal}}{I_{1,2}}}{1 - \epsilon_{cal}} \quad . \tag{13}$$

Using this expression, the values for the effective reflectivities, $R_1$ and $R_2$, are computed (step 168).

These effective reflectivity values will be used later during the processing of actual substrates to determine the in situ temperature correction as described below. It should be understood, however, that the computed effective reflectivities are valid only for the particular processing system for which the calibrations was performed. If, for example, the probe geometries are altered or the system geometry is changed, it will be necessary to recalibrate the system in the manner just described to determine new values for the effective reflectivities.

Note that this calibration procedure has established which of the $\epsilon_{eff}$ ($\epsilon$, $R_{eff}$) curves (see FIG. 2) characterizes the measurement probe in the system. From the in situ temperature measurements that are obtained during the processing of a substrate, it will be possible to determine the actual emissivity for that substrate. By knowing the actual emissivity and the $\epsilon_{eff}$ ($\epsilon$, $R_{eff}$) curve, one can then compute the effective emissivity for the substrate and from that the corrected temperature. The details of the procedure for arriving at the corrected temperature are as follows:

In Situ Temperature Correction

Usually the probe with the highest effective reflectivity, e.g., probe 150, is selected to make the temperature measurements; the other probe (152) serves as the correction probe.

Before describing the procedure for correcting the temperature readings of the measurement probe, an expression for the actual emissivity of the substrate will be derived. Recall that the effective emissivities for each probe are proportional to the corresponding radiation intensities, $I_1$ and $I_2$, as indicated in Eq. 11. Thus, the ratio of the effective emissivities is equal to the ratio of the corresponding radiation intensities, i.e.,:

$$\frac{\epsilon_1}{\epsilon_2} = \frac{I_1}{I_2} \quad . \tag{14}$$

For each probe, the effective emissivity can be expressed as a function of the actual emissivity and the corresponding effective reflectivity (from Eq. 6), i.e.,:

$$\epsilon_{1,2} = \frac{\epsilon}{1 - R_{1,2} \cdot (1 - \epsilon)} \tag{15}$$

By substituting the expressions for the effective emissivities into the above equation, the actual emissivity can be expressed in terms of the effective reflectivities and the measured intensities, as follows:

$$\epsilon = 1 - \frac{1 - \left(\frac{I_2}{I_1}\right)}{R_1 - R_2 \cdot \left(\frac{I_2}{I_1}\right)} \quad . \tag{16}$$

Having derived this expression we are now ready to described the procedure for correcting the temperature measurements.

Figures 6, 7:
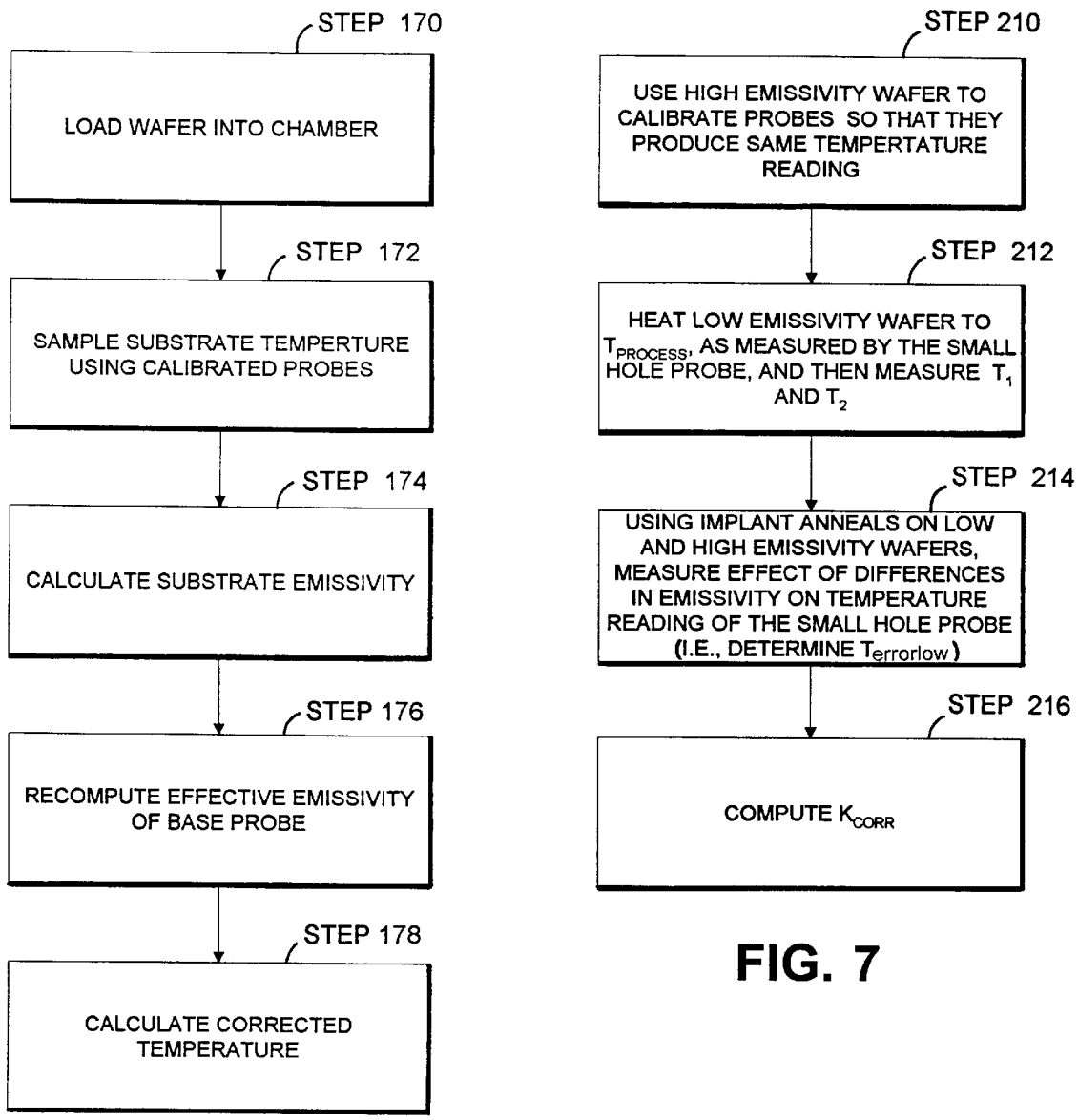
FIG. 6 is a flow diagram of a scheme for measuring the emissivity in situ to determine enhance the accuracy of a temperature measurement.
FIG. 7 is a flow chart of an alternative technique for calibrating the temperature measurement probes in an RTP chamber.

Referring to FIG. 6, at the start of an RTP run, a substrate is loaded into the processing chamber (step 170) and the temperature is cycled through a predetermined temperature sequence. While the substrate is being sequenced through the temperature sequence, the probes 150, 152 sample the radiation near a localized region of the substrate at a predetermined sampling rate (e.g., 20 Hz) (step 172). From the measured temperatures for each probe, the corresponding probe radiation intensities, $I_1$ and $I_2$, are calculated with the aid of Eq. (10). Then, the actual substrate emissivity, $\epsilon$, is computed from Eq. 16, using the previously computed values for the effective reflectivity for each probe (step 174). Once the actual substrate emissivity is known, the effective emissivity $\epsilon_1$ for the base probe 150 is computed from Eq. 15 as follows:

$$\epsilon_1 = \frac{\epsilon}{1 - R_1 \cdot (1 - \epsilon)} \tag{17}$$

Finally, a corrected temperature ($T_{corr}$) is calculated from the temperature measured by probe 150 by using the following equation derived from Eqs. 2 and 3 (step 176):

$$T_{corr} = \frac{C_2}{\log\left[\frac{K \cdot \epsilon_1}{I_1}\right]} \quad . \tag{18}$$

This algorithm is preferably implemented in software in controller 192 (FIG. 12) so that the temperature measurements of the probes are automatically corrected before any control decisions are made.

An Alternative Emissivity Correction Technique

An alternative and somewhat simpler technique exists for calibrating the system without needing to use a calibration wafer that has an embedded thermocouple. The alternative technique requires two wafers for which the emissivity of the backside is accurately known. One wafer has an emissivity, $\epsilon_{hi}$, that is close to one, and the other wafer has a lower emissivity, $\epsilon_{low}$. In the described embodiment, the high emissivity wafer is a nitride wafer having an emissivity of 0.94 and the low emissivity wafer is a polysilicon wafer with an oxide layer having an emissivity of 0.32 on the backside of the wafer, i.e., the side facing the temperature probes.

As before, two neighboring temperature probes are used. One probe, referred to hereinafter as the small hole probe, yields a high effective reflectivity. The small hole probe produces a temperature reading $T_1$ and it is used to measure the temperature of the wafer during processing. It is the temperature that is generated by this probe (i.e., $T_1$) that will be corrected to account for the emissivity of the backside of the wafer. The other probe, referred to hereinafter as the big hole probe, yields a lower effective reflectivity. The big hole probe produces a temperature reading of $T_2$ and it is used to generate the correction that will be applied to the temperature that is measured by the small hole probe.

It is desirable that the two probes be close enough to each other so that they sample the same region of the wafer at about the same time. On the other hand, if the probes are too close, the large hole probe will impact the temperature measurement of the small hole probe for low emissivity wafers. This may lead to temperature nonuniformity on the wafers with low emissivity.

In the described embodiment, the two probes are located at the same radius from the wafer center and are separated by about 0.85 inch. The small hole probe has a configuration that is used for all of the other measurement probes in the reflecting plate. For purposes of the following example, the small hole probe uses a light pipe which has a diameter of about 0.080 inch, which is positioned in a 0.085 inch diameter hole in the reflecting plate, and which has its uppermost end flush with the surface of the reflecting plate. The big hole probe also uses a 0.080 inch diameter light pipe with its uppermost end flush with the surface of the reflecting plate but positioned within a larger hole (i.e., 0.37 inch) in the reflecting plate. The purpose of the larger hole is to produce a lower effective probe emissivity (or equivalently, a lower effective reflectivity for the reflecting cavity) for the big hole probe as compared to the small hole probe. Thus, the two probes will yield measurably different temperatures. For example, the difference in measured temperature using these two probes will be about 40°–50° C. for a wafer having a backside emissivity of 0.34 and an actual temperature of 1000° C.

As stated earlier, it is desirable to produce a large difference in effective reflecting cavity reflectivities for the two probes so as to increase the signal to noise ratio of the difference temperature measurements. Thus, it should be noted that the particular manner in which this is accomplished in the described embodiment is only meant to be illustrative of one of the many different ways of achieving that objective.

As noted earlier, the energy, I, emitted by a black body is related to temperature T by Planck's law:

$$I(\lambda, T) \approx K(\lambda) \cdot e^{\left[ -\frac{c_2}{\lambda(T+273)} \right]} \quad (19)$$

In this case, since T is measured in °C., 273 is added to the temperature to produce the equivalent Kelvin temperature as required in Eq. 19. By rearranging the variables, an equation for temperature as a function of measured energy, $I_E$, can be derived:

$$T_c = \frac{c_2}{\lambda \cdot \ln\left[ \frac{K(\lambda)}{I_E} \right]} - 273. \quad (20)$$

In other words, with this equation the temperature of a black body can be computed by knowing the amount of energy being emitted from the object.

Calibration

The procedure for generating a correction factor for the temperature reading of the small hole probe is shown in FIG. 7. The procedure will now be described in detail with reference to the steps shown in FIG. 7.

Initially, the high emissivity wafer is heated in the chamber to $T_{process}$ as measured using the small hole probe and the two probes are calibrated to produce the same temperature reading (step 210). Although the actual temperature readings of the two probes prior to calibration will differ, the amount by which they differ will be small when using the high emissivity wafers.

To establish two measurements that are necessary for the calibration of the small hole probe, the low emissivity wafer is then heated to temperature, $T_{process}$. To determine the process temperature of the substrate, it is again assumed that the small hole probe accurately measures the wafer temperature of the low emissivity wafer. Note that this is an assumption that proves to be acceptable, as will become apparent below. While the wafer is at $T_{process}$, its temperature is measured using both the big hole probe and the small hole probe (step 212). The big hole probe produces a measured temperature of $T_2 = T_{big}$ and the small hole probe produces a measured temperature of $T_1 = T_{small}$. A delta temperature, $\delta T(\epsilon_{low}, T_{process})$, is defined as the difference between these two readings, i.e., $\delta T(\epsilon_{low}, T_{process}) = T_1 - T_2$.

Next, the actual sensitivity of the small hole probe to differences in wafer emissivity is determined by performing an implantation anneal on each of the wafers (i.e., the low emissivity wafer and the high emissivity wafer), using the measured temperature readings produced by the small hole probe as the actual temperature. In other words, the temperature readings produced by the small hole probe are assumed to be correct temperature readings, in spite of the fact that they are slightly incorrect. However, as is well known, the film resistivity of the implanted layer will be critically dependent upon the time and the actual temperature of the implantation anneal. Furthermore, that dependency is accurately known. Thus, by measuring the resistivities of the layer on each of two wafers, each of which has been annealed at a different process temperature for the same amount of time, it will be possible to accurately determine what the actual difference between the two process temperatures was.

When the small hole probe produces temperature readings that are the same for both the low emissivity wafer and the high emissivity wafer, the actual temperature of the low emissivity wafer will, in reality, be slightly higher than the actual temperature of the high emissivity wafer. This is because at a given actual wafer temperature, the low emissivity wafer will emit less energy than will the high emissivity wafer at the same temperature. Thus, to make the energy emitted by the low emissivity wafer equal to the energy emitted by the high emissivity wafer, its actual temperature must be slightly higher than the actual temperature of the high emissivity wafer.

To determine the difference between the two actual wafer process temperatures, one implantation anneal is performed on the high emissivity wafer, using the small hole probe to monitor the process temperature. A second implantation anneal is performed on the low emissivity wafer, again using the small hole probe to monitor process temperature. Then, the film resistivities of each of the wafers is measured and, using well know conversion charts for the particular anneal that was performed, the difference in the actual process temperatures of the two wafers can be accurately determined. The result is designated as $T_{errorlow}$ (step 214).

Alternatively to performing an implantation anneal, an oxide layer can be grown on the two wafers and then the difference in oxide thickness can be determined. The difference in oxide thicknesses can then be converted, using well known tables, to an accurate measure of the difference in the actual process temperatures that produced the two oxide thicknesses.

By modeling the actual temperature error, $T_{errorlow}$, of the small hole probe as a linear function of $\delta T(\epsilon, T)$, a correction factor, $K_{corr}$, is then computed as follows (step 216):

$$K_{corr} = \frac{T_{errorlow}}{\delta T(\epsilon_{low}, T_{process})} . \quad (21)$$

For the present example, $K_{corr}$ equals 1.246.

In Situ Temperature Correction

Figure 11:
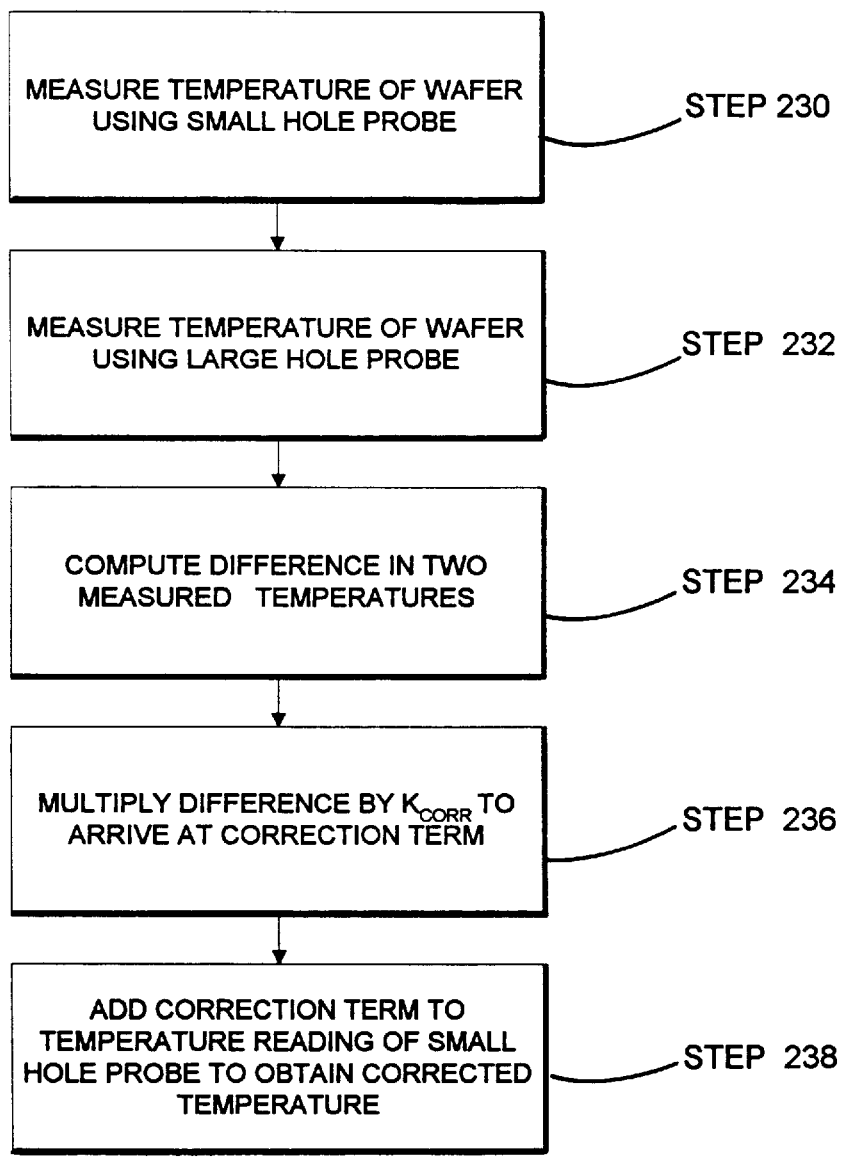
FIG. 11 shows the steps of computing a corrected temperature from a temperature measurement probe.

A corrected temperature, $T_{corr}$, is generated from the small hole probe and big hole probe temperature measurements as shown in the flow chart of FIG. 11. The wafer temperature is measured using both the small hole probe (step 230) and the big hole probe (step 232) to obtain $T_1$ and $T_2$, respectively. The difference in measured temperatures (i.e., $T_1 - T_2$) is computed (step 234) and multiplied by $K_{corr}$ (step 236) to arrive at the correction term which is them added to $T_1$ to arrive at the corrected temperature (step 238). In other words, $$T_{corr} = T_1 + K_{corr} \cdot \delta T(\epsilon, T). \quad (22)$$

The principles behind this technique and the resulting improvement in the accuracy of the temperature measurement will now be described.

In essence, the measurement of the sensitivity of the small hole probe determines which effective emissivity curve (see Eq. 15) describes applies to the small hole probe. This can be seen as follows. In performing the implantation anneal on the low emissivity wafer while using the small hole probe as a monitor of the process temperature, it is assumed that the emissivity of the wafer is one. With that assumption, the energy emitted by the wafer is equal to the energy that is emitted by an ideal black body at $T_{process}$, i.e., $I(T_{process}, \lambda)$. However, the previous determination of $T_{errlow}$ indicates that the actual temperature of the wafer is higher, namely, $T_{process}+T_{errlow}$. Thus, the energy being emitted by the wafer can also be expressed as being equal to the effective emissivity for the low emissivity wafer (i.e. $\epsilon_{eff}$,low) times the energy that would be emitted by a black body at this higher temperature (i.e., $I(T_{process}+T_{errlow}, \lambda)$). In other words, $$\epsilon_{eff,low} \cdot I(T_{process}+T_{error},\lambda) = I(T_{process},\lambda). \quad (23)$$

This can be rewritten to obtain an equation for computing $\epsilon_{eff,low}$ as follows:

$$\epsilon_{eff,low} = \frac{I(T_{process},\lambda)}{I(T_{process}+T_{error},\lambda)}. \quad (24)$$

For the described embodiment, $\epsilon_{eff,low}$ is computed to be 0.855. Then, by using Eq. 17, the effective reflectivity for the small hole probe, $R_{effsmall}$, is computed from the effective and actual emissivities of the low emissivity wafer as follows:

$$R_{effsmall} = \frac{1 - \frac{\epsilon}{\epsilon_{eff,low}}}{1 - \epsilon}. \quad (25)$$

In this example, $R_{effsmall}$ is equal to 0.92

By knowing $R_{effsmall}$ and by using Eq. 15, we can plot the apparent emissivity for the small hole probe as a function of actual wafer emissivity. This plot is shown as the upper curve in FIG. 8.

The two temperature measurements that were obtained for the high emissivity wafer, namely, $T_{big}$ and $T_{small}$ enable us to determine the effective emissivity curve of the big hole probe in a similar manner. For the big hole probe, it is known that measured emitted energy, $I(T_{big}, \lambda)$, is equal to the energy emitted by a black body at some higher temperature, $T_{actual}$, times the effective emissivity of the big hole probe, $\epsilon_{effbig}$. Similarly, for the small hole probe, it is known that measured emitted energy, $I(T_{small},\lambda)$, is equal to the energy emitted by a black body at the higher temperature, $T_{actual}$, times the effective emissivity of the small hole probe, $\epsilon_{effsmall}$. Thus, the following expression may be written:

$$\frac{I(T_{big},\lambda)}{\epsilon_{effbig}} = \frac{I(T_{small},\lambda)}{\epsilon_{effsmall}} = I_{blackbody}. \quad (26)$$

This can, in turn, be rewritten and generalized as:

$$\epsilon_{effbig} = \epsilon_{effsmall} \cdot \frac{I(T_2,\lambda)}{I(T_1,\lambda)}. \quad (27)$$

Since the effective reflectivity of the small hole probe is now known (see above), $\epsilon_{effsmall}$ can be computed from the following relationship:

$$\epsilon_a = \frac{\epsilon}{1 - (1 - \epsilon) \cdot R_{eff}}, \quad (28)$$

where $\epsilon_a$ is the apparent emissivity and $R_{eff}$ is effective reflectivity. By using the previously computed value for $R_{effsmall}$, and the actual emissivity for the high emissivity wafer (i.e., 0.94), a value for $\epsilon_{effsmall}$ can be calculated:

$$\epsilon_{effsmall} = \frac{\epsilon_{hi}}{1 - (1 - \epsilon_{hi}) \cdot R_{effsmall}}. \quad (29)$$

Plugging the value for $\epsilon_{effsmall}$ into Eq. 27 yields a value for $\epsilon_{effbig}$. In the present example, the computed value is 0.749.

Using Eq. 17, a value for the effective reflectivity for the big hole probe, i.e., $R_{effbig}$, can also be computed. In the present example, $R_{effbig}$ is equal to 0.842.

Knowing $R_{effbig}$ enables us to plot the apparent emissivity for the big hole probe. This plot is the lower curve in FIG. 8. Note that for purposes of the calibration scheme, it is desirable to have the two curves (i.e., the apparent emissivity curves for the small hole probe and the big hole probe) separated by a large amount so as to increase the signal-to-noise ratio of the calibration.

If no correction is made to the temperature measured by the small hole probe during a process run, the temperature error, $T_{errnocorr}$, will be equal to:

$$T_{errnocorr} = T - T_c(I_E), \quad (30)$$

where $$I_E = \epsilon_a(\epsilon, R_{effsmall}) \cdot I(T,\lambda). \quad (31)$$

Substituting this expression into Eq. 28 yields:

$$T_{errnocorr} = T - T_c(\epsilon_a(\epsilon, R_{effsmall}) \cdot I(T,\lambda)). \quad (32)$$

Figure 9:
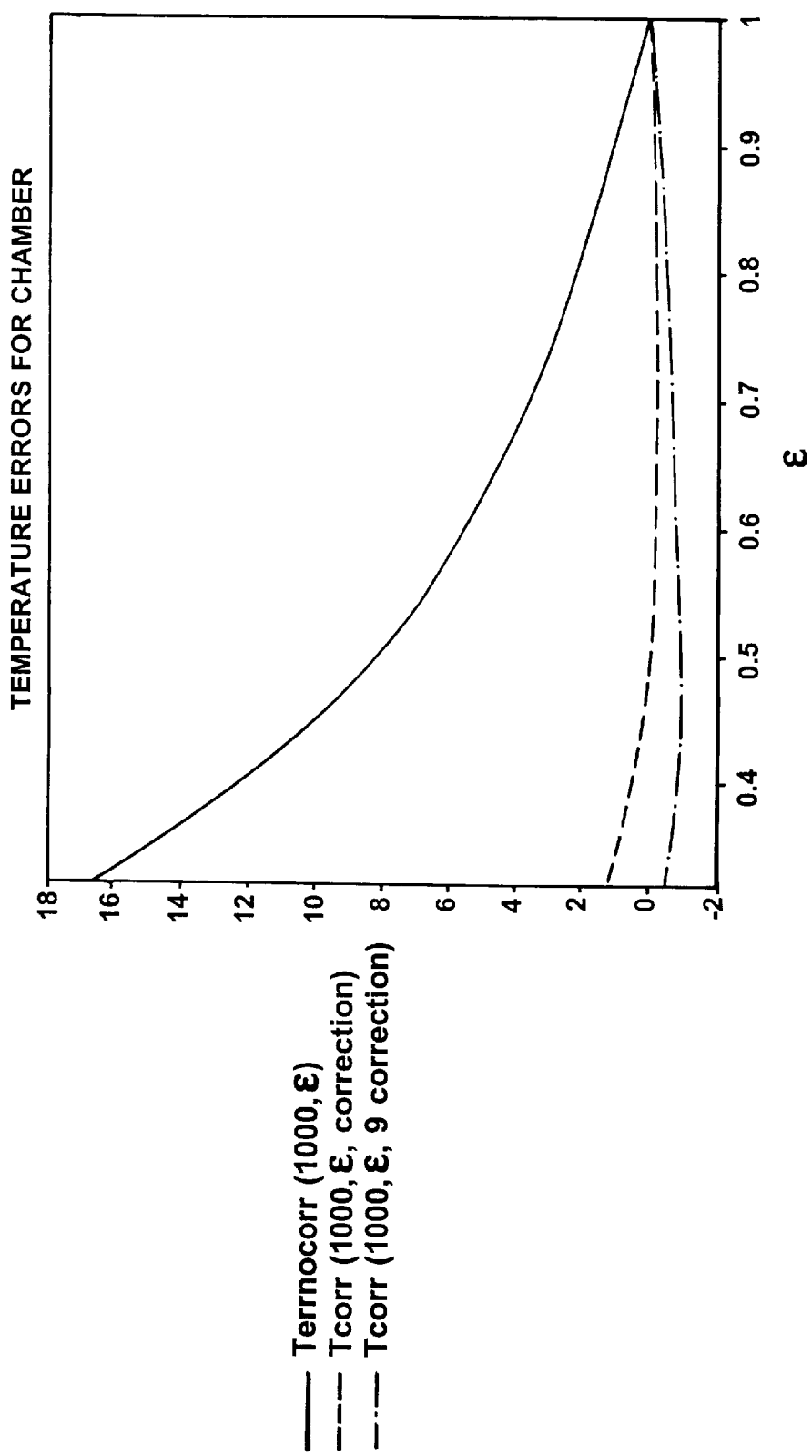
FIG. 9 shows plots of errors for the uncorrected temperature measurements and for the corrected temperature measurements, both as a function of actual wafer emissivity.

A plot of this function is shown in FIG. 9 (see upper, solid curve), which shows the error that is introduced into the uncorrected temperature measurement using the small hole probe increasing significantly with decreasing substrate emissivity.

By using Eq. 20, the difference in temperatures measured by the big hole probe and the small hole probe, i.e., $\delta T(\epsilon,T)$, can be computed as follows:

$$\delta T(\epsilon,T) = T_c(\epsilon_a(\epsilon, R_{effsmall}) \cdot I(T,\lambda)) - T_c(\epsilon_a(\epsilon, R_{effbig}) \cdot I(T,\lambda)) \quad (33)$$

The lower, dotted curve in FIG. 9 illustrates the improved accuracy of the corrected temperature measurement as a function of wafer backside emissivity. Note that over a range of emissivities from 0.3 to 1.0, the error is less than about 1° C. In other words, the corrected temperature reading from using the above-described technique is substantially improved and the sensitivity of the corrected temperature reading to variations in emissivity from one wafer top the next is greatly reduced as compared to the uncorrected temperature reading.

It is apparent from FIG. 9 that the linear approximation has generated a correction factor that has slightly overcompensated for the actual measurement error. One way to further optimize the correction factor is to simply use a smaller factor, e.g. 0.9 $K_{corr}$. If the correction factor is scaled in that way, the resulting curve more closely approaches zero error over a larger portion of the emissivity range (see dashed curve in FIG. 9).

The effects that account for the error in the small hole probe temperature measurement are energy-related effects, which introduce an exponential term. Thus, the actual errors are nonlinear. Nevertheless, the linear approximation to the error works very well in compensating for these nonlinear effects.

Of course, further optimization of the correction factor can be obtained by taking into account the nonlinear way in which the correction factor varies as a function of the temperature difference between the two probes. In many applications, however, the substantial level of improvement that is obtained from the simple linear approximation makes further refinement of the corrected temperature measurement unnecessary.

Figure 10:
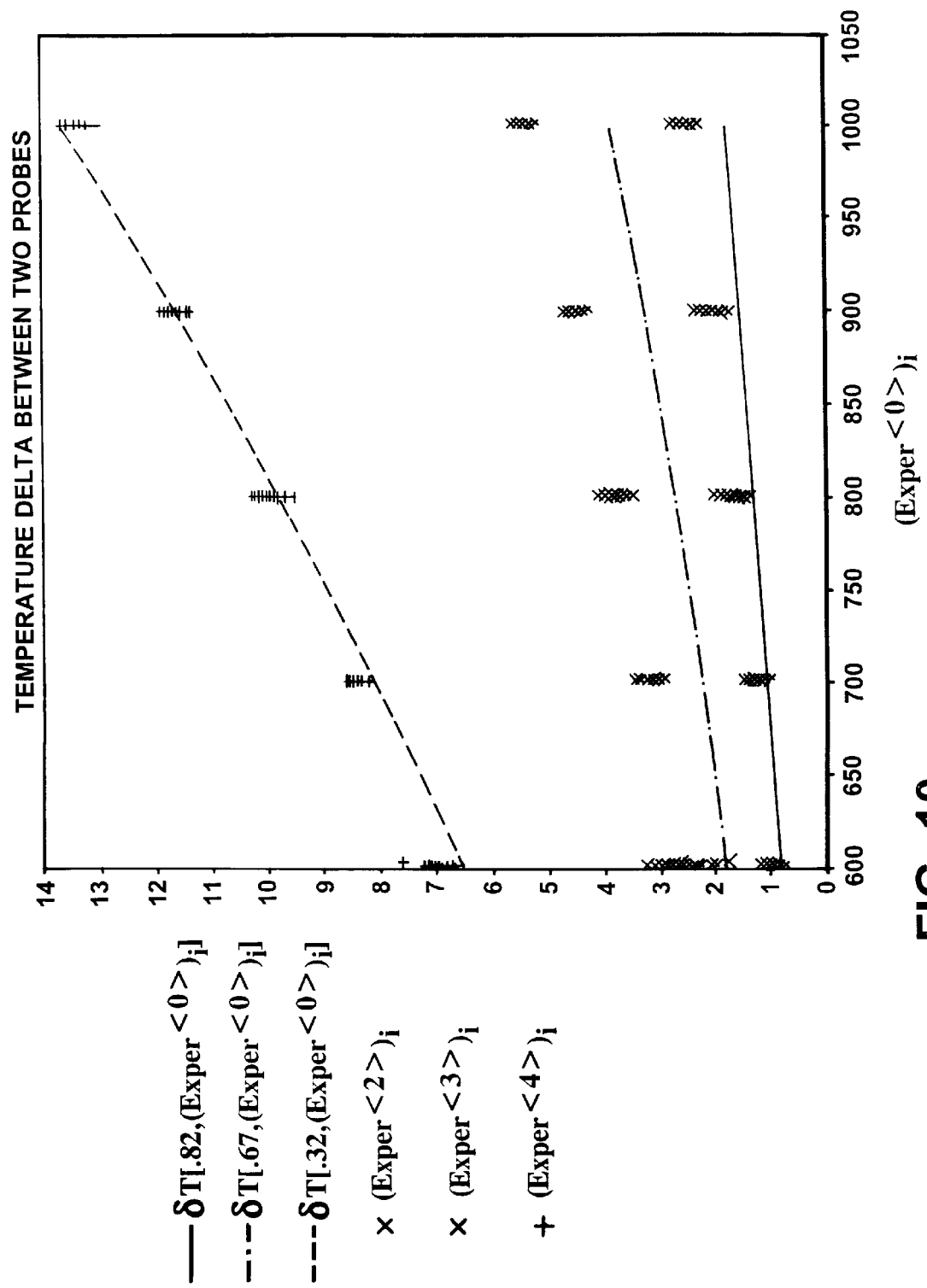
FIG. 10 shows experimental values and calculated values for the difference in temperatures measured by the small hole probe and the big hole probe.

To evaluate the accuracy of the equation for $\delta T(\epsilon,T)$ (i.e., Eq. 33), the computed values were compared to actual experimental data for the temperature difference between the two probes. This comparison is shown in FIG. 10. The top curve is for a wafer having an emissivity of 0.32, the middle curve is for a wafer having an emissivity of 0.67, and the lower curve is for a wafer having an emissivity of 0.82. The experimental data is presented as "x's" and "+'s" in the graph. To obtain the experimental data, a wafer was placed in the chamber and the temperature was ramped up to 1000° C. At every 100° C. step after 500° C., the temperature was allowed to stabilize for about 10 seconds and then a temperature reading for each of the probes was recorded. The difference between these two readings corresponds to $\delta T(\epsilon, T)$. The scatter in the data taken at each temperature is due to the noise in the measurements. FIG. 10 shows that the experimental data confirms the accuracy of the model.

It should be understood that other techniques may be used to reduce the effective reflectivity associated with the second probe. The two techniques described above involved raising the probe above the surface of the reflecting plate or enlarging the hole around the probe. Other techniques include, for example: (1) reducing the reflectivity of the reflecting plate around the probe by forming an absorbing donut around the probe (e.g. a region covered with silicon nitride); (2) reducing the reflectivity of the reflecting plate over the bandwidth of the optical pyrometer around the probe; or (3) reducing the view angle of the probe by including an aperture at the fiber output.

If a reduced viewing angle is used for the second probe, the size of the hole may be decreased while still achieving a difference in the measured temperatures using the two probes of about 40° C. Thus, using this approach, we can minimize the impact that the second probe makes on the first probe temperature measurement and this permits us to move the probes closer together.

Figure 8:
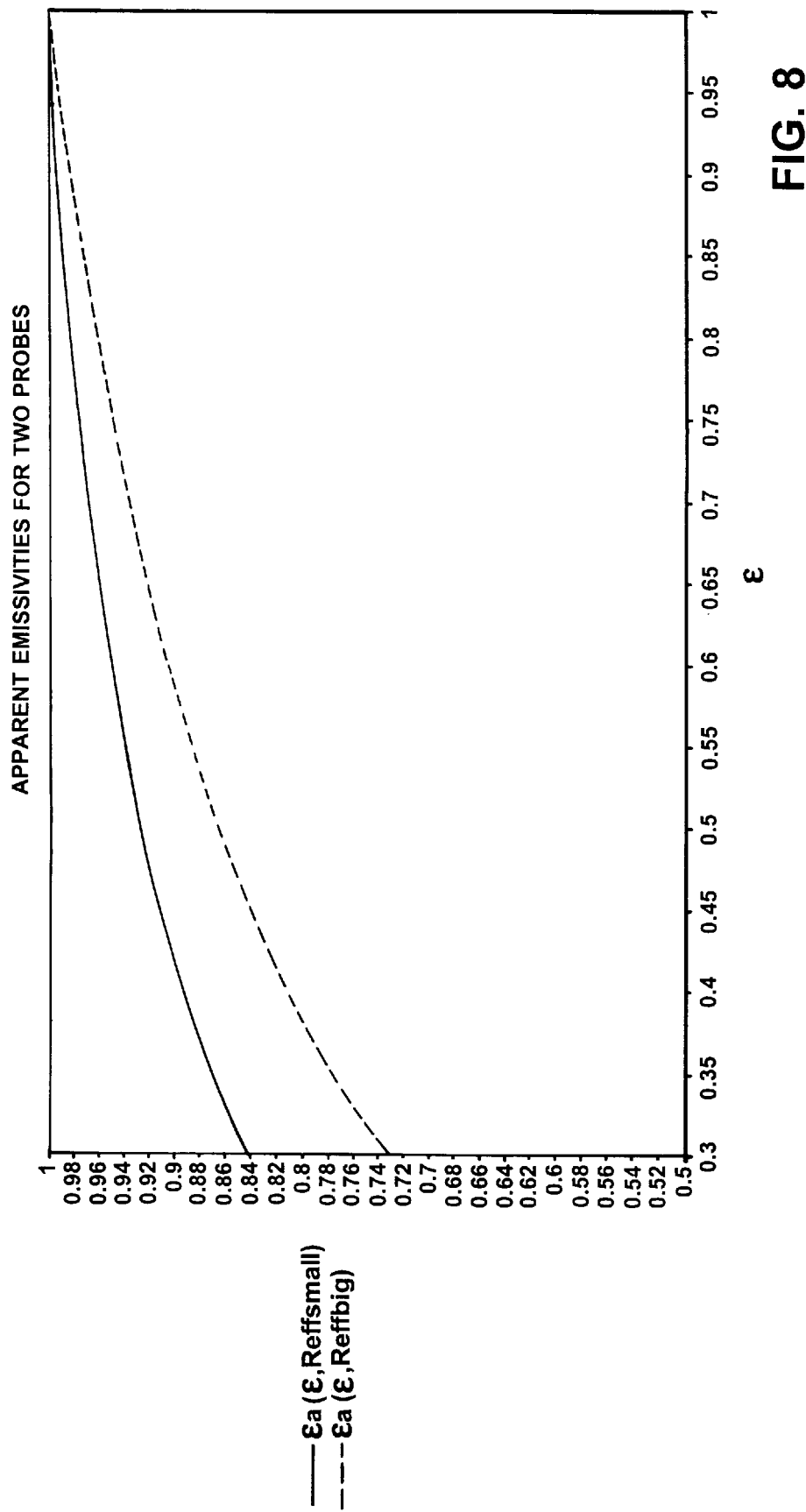
FIG. 8 shows plots of the apparent emissivity of a small hole probe and of a large hole probe, both as a function of actual wafer emissivity.

It should be noted that an alternative to performing the above-described correction techniques is redesigning the chamber so as to drive the top line in FIG. 8 higher, i.e., closer to one. But that is a much more difficult task than simply correcting for the error as described above.

Additional Details About the RTP System

As indicated above, although only two measurement probes are shown in FIG. 3A, the described embodiment actually uses eight measurement probes distributed over the reflector so as to measure the temperature at different radii of the substrate. During thermal processing, support structure 108 is rotated at about 90 RPM. Thus, each probe actually samples the temperature profile of a corresponding annular ring area on the substrate.

The support structure which rotates the substrate includes a support ring 134 which contacts the substrate around the substrate's outer perimeter, thereby leaving all of the underside of the substrate exposed except for a small annular region about the outer perimeter. Support ring 134 has a radial width of approximately one inch (2.5 cm). To minimize the thermal discontinuities that will occur at the edge of substrate 106 during processing, support ring 134 is made of the same, or similar, material as the substrate, e.g. silicon or silicon carbide.

Support ring 134 rests on a rotatable tubular quartz cylinder 136 that is coated with silicon to render it opaque in the frequency range of the pyrometers. The silicon coating on the quartz cylinder acts as a baffle to block out radiation from external sources that might contaminate the intensity measurements. The bottom of the quartz cylinder is held by an annular upper bearing race 141 which rests on a plurality of ball bearings 137 that are, in turn, held within an stationary, annular, lower bearing race 139. The ball bearings 137 are made of steel and coated with silicon nitride to reduce particulate formation during operation. Upper bearing race 141 is magnetically-coupled to an actuator (not shown) which rotates cylinder 136, guard ring 134 and substrate 106 at about 90 RPM during thermal processing.

Figure 3B:
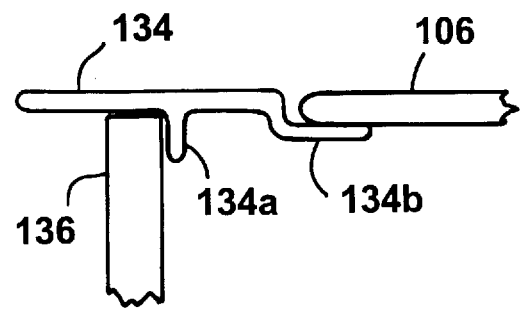
FIG. 3B shows details of the support ring.

Referring to FIG. 3B, the support ring 134 is designed to create a light tight seal with the quatrz cylinder 136. Extedning from the bottom surface of the support ring 134 is a cylindrically-shaped lip 134a which has an outside diameter that is slightly smaller than the inside diameter of the quartz cylinder, so that it fits into the cylinder, as shown, and forms a light seal. On the inside region of the support ring, there is a shelf 134b for supporting substrate 106. The shelf 134b is a region around the inside circumference of the support ring that is lower than the rest of the support ring.

A purge ring 145 that is fitted into the chamber body surrounds the quartz cylinder. Purge ring 145 has an internal annular cavity 147 which opens up to a region above upper bearing race 141. Internal cavity 147 is connected to a gas supply (not shown) through a passageway 147. During processing, a purge gas is flowed into the chamber through purge ring 145.

Support ring 134 has an outer radius that is larger than the radius of the quartz cylinder so that it extends out beyond the quartz cylinder. The annular extension of the support ring beyond cylinder 136, in cooperation with purge ring 145 located below it, functions as a baffle which prevents stray light from entering the reflecting cavity at the backside of the substrate. To further reduce the possibility of stray light reflecting into the reflecting cavity, support ring 134 and purge ring 145 may also be coated with a material that absorbs the radiation generated by heating element 110 (e.g., a black or grey material).

As indicated above, light pipes 126 are made of sapphire. Sapphire light pipes are generally preferred because they have relatively small scattering coefficients and they tend to have greater transverse light rejection, thus they provide greater measurement localization. However, the light pipes can be made of any appropriate heat-tolerant and corrosion-resistant material, e.g., quartz, that can transmit the sampled radiation to the pyrometer. Suitable quartz fiber light pipes, sapphire crystal light pipes, and light pipe/conduit couplers may be obtained from the Luxtron Corporation-Accufiber Division, 2775 Northwestern Parkway, Santa Clara, Calif. 95051-0903. Alternatively, the radiation sampling system could be an optical system that includes a small-radius objective lens mounted in reflector 102 and a system of mirrors and lenses which communicate radiation collected by the lens to the pyrometer. Such a scheme may be less expensive than sapphire light pipes if appropriate off-the-shelf optical elements can be found. Alternatively, light pipes can also be made from a tube with a highly polished reflective inner surface.

A suitable heating element 110 is disclosed in U.S. Pat. No. 5,155,336, incorporated herein by reference. This heating element uses 187 light pipes to deliver highly collimated radiation from tungsten-halogen lamps to processing chamber 100. The lamps are divided into twelve zones which are located in a radially symmetrical manner. The zones can be individually adjusted to allow the radiative heating of different areas of substrate 106 to be controlled.

In the embodiment of FIG. 3A, base 116 includes a circulation circuit 146 through which coolant circulates, thereby cooling the reflector and the reflecting surface. Water which is typically at about 23° C. is circulated through the base 116 to keep the temperature of the reflector well below that of the heated substrate (e.g., 100° C. or less). It is important to cool the reflector during RTP to discourage any possible chemical activity that might occur on its surface 120. If the reflector is allowed to heat up, this will tend to increase surface oxidation which could seriously degrade the reflectivity of the reflecting layer. Achieving an effective emissivity enhancement depends on having and maintaining a highly reflective surface. In addition, as the reflector assembly heats up it will become a source of radiation which will contaminate the sampled signal.

In the described embodiment, pyrometer 128 has a narrow bandwidth (e.g. about 40 nm) located at about 950 nm. It may also be desirable to coat the backside of quartz window 114 with an inert material which is transparent to thermal radiation in all but this narrow band of wavelengths, thereby reducing the likelihood that the heat source will introduce stray radiation into the reflecting cavity.

In general, it is desirable in a system for processing silicon substrates to use a pyrometer that detects long radiation wavelengths (e.g. wavelengths greater than about 3.5 to 4 $\mu$m). However, this approach is best suited for temperatures above 700° C. At room temperature, a silicon wafer is transparent to wavelengths of light longer than 1.0 $\mu$m. As the temperature of the substrate increases, the substrate becomes opaque to the longer wavelengths until, at about 700° C., the substrate becomes opaque to all wavelengths of interest. Thus, at temperatures below 700° C., a long wavelength sensitive pyrometer will be more apt to also detect light coming directly from the heat source. In short, the wavelength sampled by the pyrometer should take into account the process temperature. If the process temperature is substantially below 700° C., then the pyrometer should sample wavelengths shorter than 1.1 $\mu$m. If higher process temperatures are used, then longer wavelengths can be sampled.

It should also be noted that at very low process temperatures (e.g., 600° K. (327° C.), only a small amount of black body spectral radiation is generated at wavelengths shorter than 1.1 $\mu$m. As a result, at temperatures below 600° K., it becomes quite difficult to obtain a satisfactory signal-to-noise ratio.

In one design, particularly suitable for process temperatures between 900° and 1350° C., a solid-state pyrometer is used that is sensitive to radiation at wavelengths between 0.9 $\mu$m and 1.0 $\mu$m (e.g., a 900-LP-6.35C sensor combined with a 100-S8MS-B-8CV electronics box, both of which are available from Luxtron Corporation-Accufiber Division). In this temperature range, there is substantial amount of radiation produced in the wavelength range 0.9–1.0 $\mu$m, providing high signal strengths and high signal-to-noise ratios.

Figure 12:
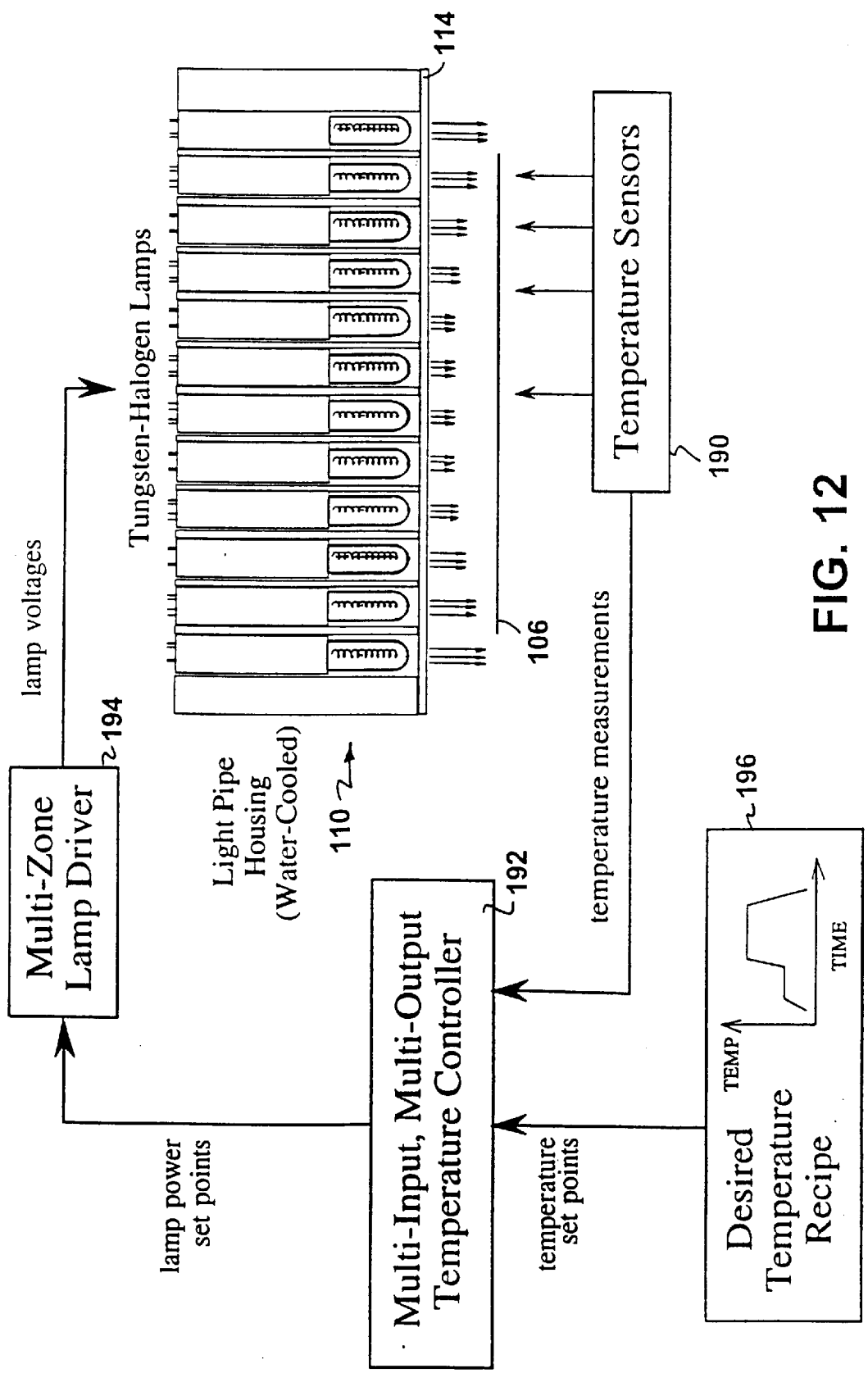
FIG. 12 is a schematic diagram of a temperature control system.

FIG. 12 shows a control loop for heating the substrate to the desired temperature. It uses the sampled output from a plurality of temperature sensors 190 (i.e., pyrometers and light pipes). The heating element 110 includes a 187 tungsten-halogen lamps that are arranged in radial zones. Each zone of lamps is separately powered by a multi-zone lamp driver 194 that is, in turn, controlled by a multi-input, multi-output controller 192. Since the substrate rotates at about 90 rpm and temperature measurements are made at different radial locations on the backside of substrate 106, each temperature probe produces an average temperature over a different annular region of the substrate. The annular regions coincide with the radial zones of the heat lamp. Controller 192 receives the temperature measurements that are generated by temperature sensors 190, corrects the temperatures based upon the above-described temperature correction algorithm, and adjusts the power level of the heating lamps to achieve a substrate temperature as specified by a predefined temperature cycle profile 196 that is supplied to controller 192. Throughout the process cycle, the controller automatically adjusts the power levels delivered to the different lamp zones so that any temperature deviations away from the desired temperature profile are corrected for.

Other embodiments are within the scope of the following claims.

What is claimed is:

1. A method of calibrating a temperature measurement system comprising:

heating a first substrate having a high emissivity value to a first process temperature;

while the first substrate is at the first process temperature, calibrating a first probe and a second probe to produce temperature indications from the first substrate that are substantially the same, said first probe having associated therewith a first effective reflectivity and said second probe having associated therewith a second effective reflectivity, said first and second effective reflectivities being different;

heating a second substrate having a low emissivity value to a second process temperature, said low emissivity value being lower than said high emissivity value;

with the second substrate at said second process temperature, using both the first probe and the second probe to measure the temperature of the second substrate, the first probe producing a first temperature indication and the second probe producing a second temperature indication different from the first temperature indication;

measuring a sensitivity of the first probe to changes in substrate emissivity; and by using said measured sensitivity and the first and second temperature indications, computing a correction factor for the first probe, said correction factor to be applied to subsequent temperature readings of the first probe to produce corrected temperature readings.

2. The method of claim 1 wherein the high emissivity value is close to one.

3. The method of claim 1 wherein the first effective reflectivity is larger than said second effective reflectivity.

4. The method of claim 3 wherein the step of computing comprises computing a difference between the first and second temperature indications and using the computed difference to compute the correction factor.

5. The method of claim 4 wherein the step of measuring said sensitivity comprises additionally thermally processing said first and second substrates, and then measuring a difference in characteristics of said additionally thermally processed first and second substrates to determine said sensitivity.

6. The method of claim 5 wherein the step of additionally thermally processing said first and second substrates comprises performing an implantation anneal on each of the first and second substrates.

7. The method of claim 6 wherein the step of measuring a difference in characteristics of said additionally thermally processed first and second substrates comprises measuring a resistivity of an implantation layer on each of said additionally thermally processed first and second substrates.

8. The method of claim 5 wherein the step of additionally thermally processing said first and second substrates comprises growing an oxide layer on each of said first and second substrates.

9. The method of claim 8 wherein the step of measuring a difference in characteristics of said additionally thermally processed first and second substrates comprises measuring a thickness of the oxide layer on each of the additionally thermally processed first and second substrates.

10. The method of claim 5 wherein the first temperature indication is $T_1$, the second temperature indication is $T_2$, and the measured sensitivity is $T_{errorlow}$ and wherein the correction factor is $K_{corr}$ which is computed as follows: $K_{corr} = K \times T_{errorlow} \times (T_1 - T_2)^{-1}$, where K is a positive number.

11. The method of claim 10 wherein K=1.

12. The method of claim 10 wherein K is less than 1.

* * * * *